US011765947B2

United States Patent
Jeon et al.

(10) Patent No.: US 11,765,947 B2
(45) Date of Patent: Sep. 19, 2023

(54) DISPLAY DEVICE AND METHOD FOR FABRICATING THE SAME

(71) Applicant: Samsung Display Co., LTD., Yongin-si (KR)

(72) Inventors: Kyung Jin Jeon, Incheon (KR); So Young Koo, Yongin-si (KR); Eok Su Kim, Seoul (KR); Hyung Jun Kim, Seoul (KR); Jun Hyung Lim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 232 days.

(21) Appl. No.: 17/107,638

(22) Filed: Nov. 30, 2020

(65) Prior Publication Data

US 2021/0320162 A1    Oct. 14, 2021

(30) Foreign Application Priority Data

Apr. 9, 2020    (KR) .......................... 10-2020-0043332

(51) Int. Cl.
*H01L 27/32* (2006.01)
*H10K 59/131* (2023.01)
(Continued)

(52) U.S. Cl.
CPC ......... *H10K 59/131* (2023.02); *H10K 59/122* (2023.02); *H10K 59/1201* (2023.02)

(58) Field of Classification Search
CPC ............. H01L 27/3276; H01L 27/3246; H01L 2227/323
See application file for complete search history.

(56) References Cited

U.S. PATENT DOCUMENTS

| 2009/0109361 A1* | 4/2009 | Ishii | .................... G09G 3/3659 |
| | | | 345/94 |
| 2013/0037818 A1* | 2/2013 | Lee | .................... H01L 27/1288 |
| | | | 438/34 |

(Continued)

FOREIGN PATENT DOCUMENTS

| KR | 100987589 B1 | 10/2010 |
| KR | 20150062540 A * | 6/2015 |

(Continued)

*Primary Examiner* — Peter Bradford
(74) *Attorney, Agent, or Firm* — CANTOR COLBURN LLP

(57) ABSTRACT

A display device includes a substrate, a first conductive layer on the substrate and including a lower light blocking pattern and a first signal line, a buffer layer on the first conductive layer, a semiconductor layer on the buffer layer and including a first semiconductor pattern and a second semiconductor pattern separated from the first semiconductor pattern, an insulating layer on the semiconductor layer and including an insulating layer pattern, a second conductive layer on the insulating layer and including a second signal line, a planarization layer on the second conductive layer, and a third conductive layer on the planarization layer and including an anode electrode. The first semiconductor pattern is electrically connected to the lower light blocking pattern by the anode electrode, and at least a portion of the second semiconductor pattern is isolated from and overlaps each of the first signal line and the second signal line.

10 Claims, 23 Drawing Sheets

(51) Int. Cl.
*H10K 59/122* (2023.01)
*H10K 59/12* (2023.01)

(56) References Cited

U.S. PATENT DOCUMENTS

| | | | | |
|---|---|---|---|---|
| 2015/0155303 A1* | 6/2015 | Kim | ...................... | H01L 27/124 |
| | | | | 438/158 |
| 2015/0179724 A1* | 6/2015 | Lee | ................... | H01L 21/28008 |
| | | | | 438/23 |
| 2016/0071891 A1* | 3/2016 | Oh | ...................... | H01L 27/1262 |
| | | | | 438/151 |
| 2016/0116800 A1* | 4/2016 | Yun | ................... | G02F 1/133528 |
| | | | | 359/247 |
| 2018/0330672 A1* | 11/2018 | Park | ...................... | G09G 3/3233 |
| 2019/0123114 A1* | 4/2019 | Park | ................... | H01L 27/3223 |

FOREIGN PATENT DOCUMENTS

| | | |
|---|---|---|
| KR | 1020150073611 A | 7/2015 |
| KR | 1020160029487 A | 3/2016 |
| KR | 101875774 B1 | 7/2018 |

\* cited by examiner

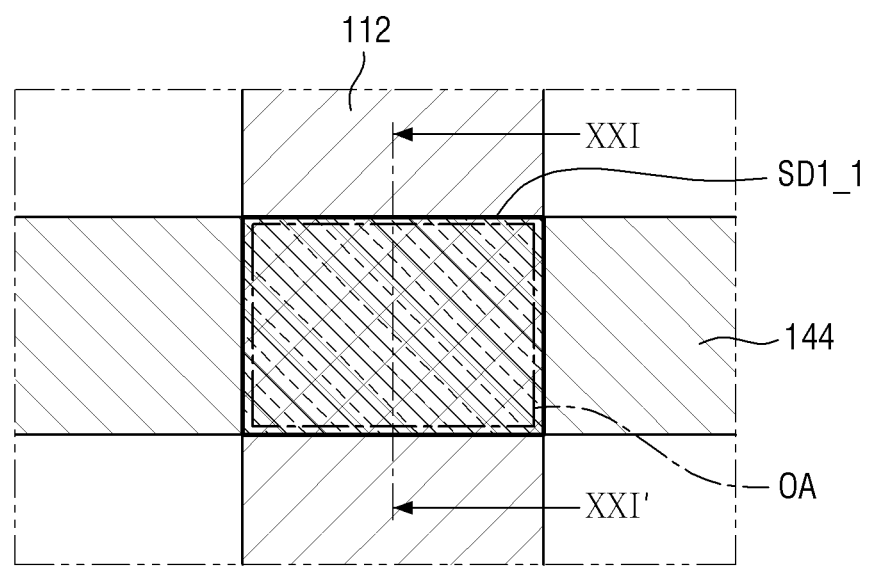
FIG. 20
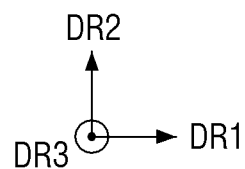

DISPLAY DEVICE AND METHOD FOR FABRICATING THE SAME

This application claims priority to Korean Patent Application No. 10-2020-0043332, filed on Apr. 9, 2020, and all the benefits accruing therefrom under 35 U.S.C. § 119, the content of which in its entirety is herein incorporated by reference.

BACKGROUND

1. Technical Field

The present disclosure relates to a display device and a method for fabricating the same.

2. Description of the Related Art

An electronic device such as a television, a smart phone, a tablet PC, a digital camera, a laptop computer, and a navigation system, which provides an image to a user, includes a display device for displaying an image.

The display device is a device for displaying an image, and includes a display panel, such as an organic light emitting display panel or a liquid crystal display panel. Among them, a light emitting display panel may include a light emitting element. Examples of a light emitting diode ("LED") include an organic light emitting diode ("OLED") using an organic material as a fluorescent material, and an inorganic light emitting diode using an inorganic material as a fluorescent material.

The display device may include a plurality of pixels and a pixel circuit for driving each pixel. Each pixel circuit includes a thin film transistor and a wiring formed on an insulating substrate.

SUMMARY

A parasitic capacitor may be generated in a portion where the wirings overlap within each pixel. Aspects of the present disclosure provide a display device capable of suppressing or preventing the formation of parasitic capacitors.

Aspects of the present disclosure also provide a method of fabricating a display device capable of suppressing or preventing the formation of parasitic capacitors.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

An embodiment of a display device includes a substrate, a first conductive layer disposed on the substrate and including a lower light blocking pattern and a first signal line, a buffer layer disposed on the first conductive layer, a semiconductor layer disposed on the buffer layer and including a first semiconductor pattern including a channel region of a transistor and a second semiconductor pattern separated from the first semiconductor pattern, an insulating layer disposed on the semiconductor layer and including an insulating layer pattern, a second conductive layer disposed on the insulating layer and including a second signal line, a planarization layer disposed on the second conductive layer, and a third conductive layer disposed on the planarization layer and including an anode electrode, where the first semiconductor pattern is electrically connected to the lower light blocking pattern by the anode electrode, and where at least a portion of the second semiconductor pattern is isolated from and overlaps each of the first signal line and the second signal line in a thickness direction.

In an embodiment of a display device including a storage capacitor and at least one transistor including a first semiconductor pattern, the display device includes a substrate, a first conductive layer disposed on the substrate and including a first electrode of the storage capacitor and a first signal line, a buffer layer disposed on the first conductive layer, a semiconductor layer disposed on the buffer layer and including the first semiconductor pattern and a second semiconductor pattern separated from the first semiconductor pattern, an insulating layer disposed on the semiconductor layer, and a second conductive layer disposed on the insulating layer and including a gate electrode of the transistor, a second electrode of the storage capacitor, and a second signal line, where the first signal line and the second signal line overlap each other at least in a partial region in a thickness direction, where at least a portion of the second semiconductor pattern is disposed in an overlap region where the first signal line and the second signal line overlap each other, and where in the overlap region, a distance in the thickness direction between the first signal line and the second signal line is greater than a distance in the thickness direction between the first electrode and the second electrode of the storage capacitor.

An embodiment of a method for fabricating a display device, the method includes forming a first conductive layer including a first signal line and a first electrode of a storage capacitor on a substrate, forming a buffer layer on the substrate to cover the first conductive layer, depositing a semiconductor layer material and an insulating layer on an entirety of the buffer layer, etching the semiconductor layer material and the insulating layer material to form an insulating layer and a semiconductor layer, respectively, where the semiconductor layer includes a first semiconductor pattern of a transistor and a second semiconductor pattern separated from the first semiconductor pattern, and forming a second conductive layer including a gate electrode of the transistor, a second electrode of the storage capacitor, and a second signal line on the insulating layer, where the first signal line and the second signal line overlap each other at least in a partial region in a thickness direction, where at least a portion of the second semiconductor pattern is disposed in an overlap region where the first signal line and the second signal line overlap each other in the thickness direction, and where in the overlap region, a distance in the thickness direction between the first signal line and the second signal line is greater than a distance in the thickness direction between the first electrode and the second electrode of the storage capacitor.

According to the display device and the method of fabricating the display device according to an exemplary embodiment, it is possible to suppress or prevent the formation of parasitic capacitors and to increase the reliability of products.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail exemplary embodiments thereof with reference to the attached drawings, in which:

FIG. 20 is an enlarged view of a peripheral region of a first semiconductor dummy pattern according to another embodiment;

DETAILED DESCRIPTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Hereinafter, exemplary embodiments of the present disclosure will be described in detail with reference to the accompanying drawings.

Figure 1:
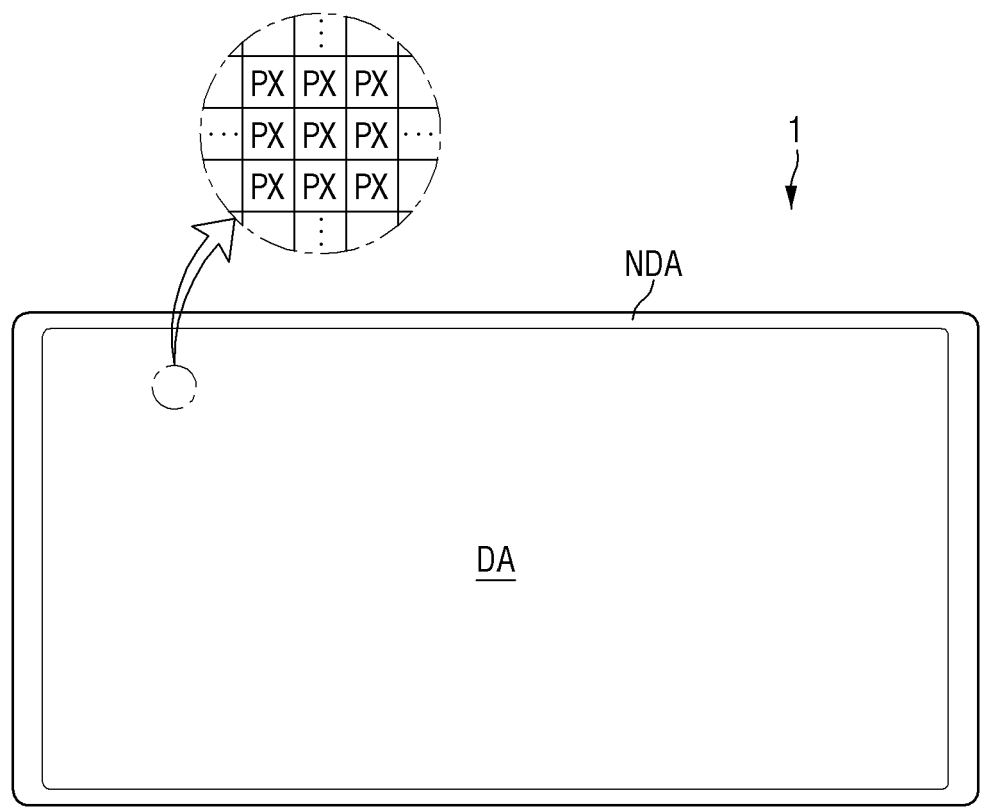
FIG. 1 is a plan view of a display device according to an exemplary embodiment.

FIG. 1 is a plan view of a display device according to an exemplary embodiment.

Referring to FIG. 1, a display device 1 is a device for displaying a moving image or a still image. The display device 1 may be used as a display screen of various products such as televisions, laptop computers, monitors, billboards and the Internet of Things as well as portable electronic devices such as mobile phones, smart phones, tablet personal computers ("tablet PCs"), smart watches, watch phones, mobile communication terminals, electronic notebooks, electronic books, portable multimedia players ("PMPs"), navigation systems and ultra mobile PCs ("UMPCs").

The display device 1 according to an exemplary embodiment may have a substantially rectangular shape in a plan view. The display device 1 may have a rectangular shape with right-angled corners in the plan view. However, without being limited thereto, the display device 1 may have a rectangular shape with rounded corners in the plan view in another exemplary embodiment.

In the drawings, a first direction DR1 indicates a horizontal direction (e.g., direction of the long side) of the display device 1 in the plan view, and a second direction DR2 indicates a vertical direction (e.g., direction of the short side) of the display device 1 in the plan view. Further, a third direction DR3 indicates a thickness direction of the display device 1. The first direction DR1 and the second direction DR2 perpendicularly intersect each other. The third direction DR3 is a direction intersecting the plane on which the first direction DR1 and the second direction DR2 are located, and perpendicularly intersects both the first direction DR1 and the second direction DR2. It should be understood, however, that a direction mentioned in the embodiment refers to a relative direction, and the embodiment is not limited to the direction mentioned.

Unless otherwise defined, the terms "above," "top surface," and "upper side" as used herein refer to a display surface's side of the display device 1, and the terms "below," "bottom surface," and "lower side" as used herein refer to a side opposite to the display surface of the display device 1.

Figure 2:
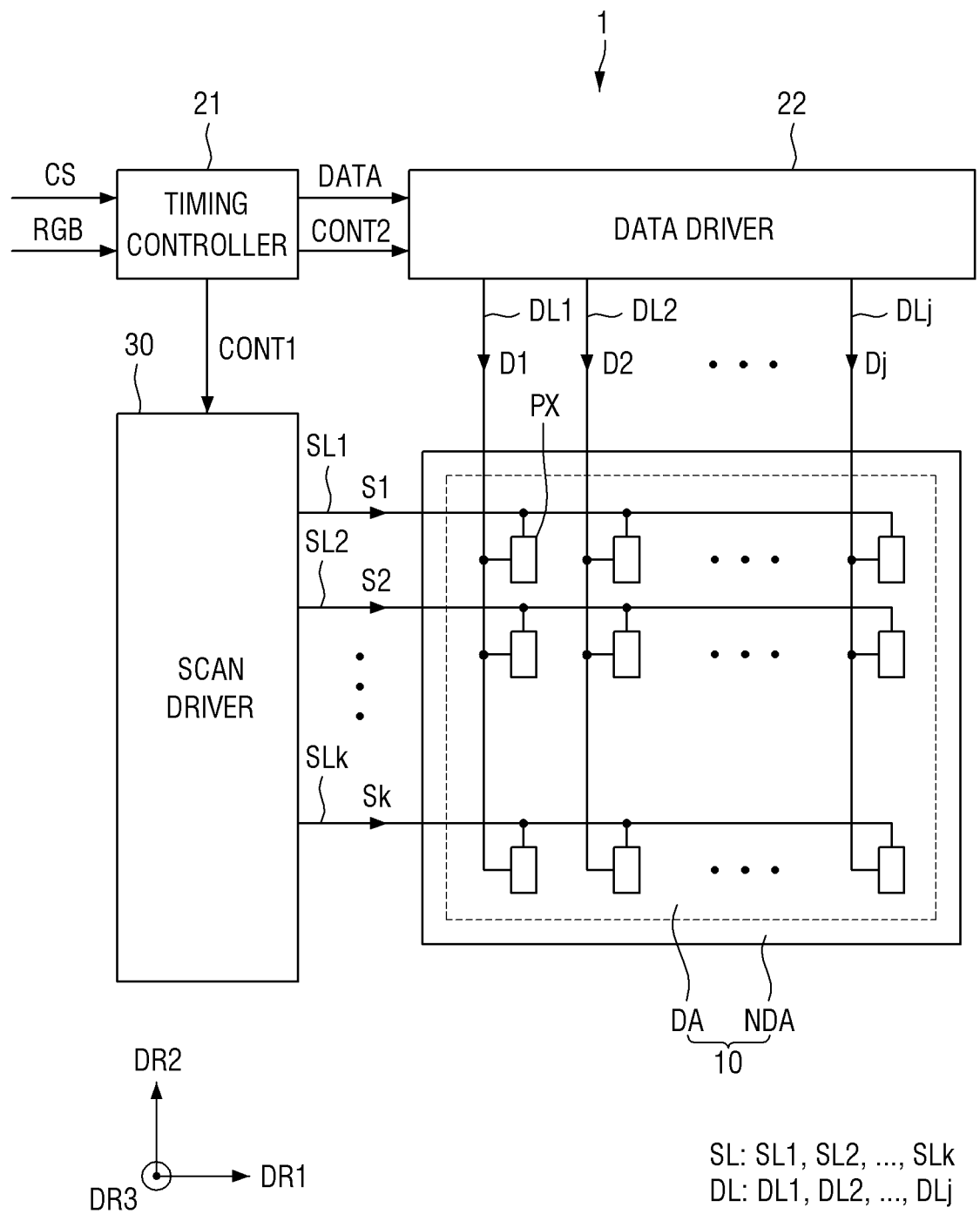
FIG. 2 is a block diagram schematically showing a display device according to an exemplary embodiment.

FIG. 2 is a block diagram schematically showing a display device according to an exemplary embodiment.

Referring to FIGS. 1 and 2, the display device 1 according to an exemplary embodiment may include a display panel 10, a timing controller 21, a data driver 22, and a scan driver 30.

The display panel 10 may be an organic light emitting display panel. In the following embodiments, a case where the organic light emitting display panel is used as the display panel 10 will be described as an example, but the present disclosure is not limited thereto, and other types of display panels such as a liquid crystal display ("LCD") panel, a quantum dot display ("QD-Display") panel and a micro LED panel may be used as the display panel 10 in another exemplary embodiment.

The display panel 10 may include a display area DA displaying an image and a non-display area NDA where no display of an image is performed. The display panel 10 may be divided into the display area DA and the non-display area NDA in the plan view. The non-display area NDA may be disposed to surround the display area DA. The non-display area NDA may form a bezel.

The display area DA may have a rectangular shape with right-angled or rounded corners in the plan view. However, the planar shape of the display area DA is not limited to a rectangular shape, but may have a circular shape, an elliptical shape, or various other shapes.

The display area DA may include a plurality of pixels PX. The pixels PX may be arranged in a matrix. Each pixel PX may include a light emitting layer and a circuit layer for controlling the light emission amount of the light emitting layer. The circuit layer may include a wiring, an electrode, and at least one transistor. The light emitting layer may include an organic light emitting material. The light emitting layer may be encapsulated by an encapsulation layer. Hereinafter, a case where the light emitting layer is an organic light emitting layer will be described, but the present disclosure is not limited thereto. A detailed configuration of the pixel PX will be described later.

The non-display area NDA may be disposed adjacent to both the short sides and both the long sides of the display area DA. In this case, the non-display area NDA may surround all sides of the display area DA and form edges of the display area DA. However, the present disclosure is not limited thereto, and the non-display area NDA may be disposed adjacent to both short sides or both long sides of the display area DA, not all the short and long sides of the display area DA.

In the display area DA, not only the pixels PX, but also a plurality of scan lines SL1 to SLk (k is an integer of 2 or more), a plurality of data lines DL1 to DLj (j is an integer of 2 or more) and a plurality of power lines (not shown), which are connected to the pixels PX, may be disposed. The scan lines SL may extend in the first direction DR1 and may be arranged along the second direction DR2. The data lines DL may extend in the second direction DR2 and may be arranged along the first direction DR1.

The display panel 10 includes the plurality of pixels PX located at intersections of the plurality of scan lines SL1 to SLk (k is an integer of 2 or more) and the plurality of data lines DL1 to DLj (j is an integer of 2 or more) and arranged in a matrix. Each pixel PX may be connected to at least one of the scan lines SL and one of the data lines DL.

The timing controller 21 receives an image signal RGB and timing signals CS from a host system. The timing signals CS may include a vertical sync signal, a horizontal sync signal, a data enable signal and a dot clock. The host system may be an application processor of a smartphone or tablet PC, a monitor or a system on chip of a TV, or the like.

The timing controller 21 generates control signals for controlling the operation timings of the data driver 22 and the scan driver 30. The control signals may include a source control signal CONT2 for controlling the operation timing of the data driver 22 and a scan control signal CONT1 for controlling the operation timing of the scan driver 30.

The scan driver 30 receives the scan control signal CONT1 from the timing controller 21. The scan driver 30 generates scan signals S1 to Sk (k is an integer of 2 or more) according to the scan control signal CONT1 and supplies the scan signals to the scan lines SL1 to SLk of the display panel 10. The scan driver 30 may include a plurality of transistors and may be disposed in the non-display area NDA of the display panel 10. Alternatively, the scan driver 30 may be formed as an integrated circuit, and in this case, may be mounted on a gate flexible film attached to the other side of the display panel 10.

The data driver 22 receives digital video data DATA and the source control signal CONT2 from the timing controller 21. The data driver 22 converts the digital video data DATA into analog data voltages according to the source control signal CONT2 and supplies the analog data voltages to the data lines DL1 to DLj of the display panel 10. Each of the pixels PX emits light having a predetermined luminance by driving current supplied to a light emitting element according to data signals D1 to Dj (j is an integer of 2 or more) transmitted through the data lines DL1 to DLm.

A power supply circuit (not shown) may generate voltages required for driving the display panel 10 from a main power source applied from a system board and supply the voltages to the display panel 10. For example, the power supply circuit (not shown) may supply a first source voltage ELVDD (shown in FIG. 3) and a second source voltage ELVSS (shown in FIG. 3) for driving a light emitting element OLED of the display panel 10 from the main power source, and may supply the first source voltage ELVDD and the second source voltage ELVSS to a first power line ELVDL (shown in FIG. 3) and a second power line ELVSL (shown in FIG. 3) of the display panel 10, respectively. Further, the power supply circuit (not shown) may generate and supply driving voltages for driving the timing controller 21, the data driver 22, the scan driver 30 and the like from the main power source. The power supply circuit (not shown) may be formed as an integrated circuit and mounted on a circuit board, but the present disclosure according to the invention is not limited thereto.

Figure 3:
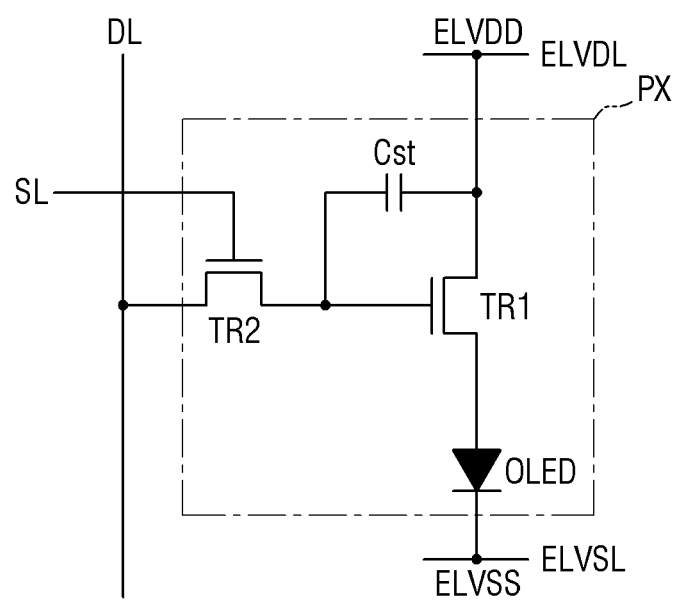
FIG. 3 is an equivalent circuit diagram of one pixel of a display device according to an exemplary embodiment.

FIG. 3 is an equivalent circuit diagram of one pixel of a display device according to an exemplary embodiment.

Referring to FIG. 3, the pixel PX may include a first transistor TR1, a second transistor TR2, a light emitting element OLED, and a storage capacitor Cst. Although FIG. 3 illustrates that each pixel PX has a 2Transistor-1Capacitor ("2T1C") structure having two transistors TR1 and TR2 and one storage capacitor Cst, the present disclosure is not limited thereto. Each pixel PX may include a plurality of transistors and a plurality of capacitors. For example, various modified pixel structures such as a 3T1C structure, a 6T1C structure and a 7T1C structure may be applied to each pixel PX in another exemplary embodiment.

Each of the first and second transistors TR1 and TR2 may include a first source/drain electrode, a second source/drain electrode, and a gate electrode. One of the first source/drain electrode and the second source/drain electrode may be a source electrode, and the other one may be a drain electrode.

Each of the first and second transistors TR1 and TR2 may be formed of a thin film transistor. Further, although FIG. 3 illustrates that each of the first and second transistors TR1 and TR2 is formed of an N-type metal oxide semiconductor field effect transistor ("MOSFET"), the present disclosure is not limited thereto. Each of the first transistor TR1 and the second transistor TR2 may be formed of a P-type MOSFET in another exemplary embodiment. In this case, the positions of the source electrode and the drain electrode of each of the first transistor TR1 and the second transistor TR2 may be changed each other. In the following description, it is assumed that the first and second transistors TR1 and TR2 are N-type MOSFETs.

The first transistor TR1 may be a driving transistor. Specifically, the gate electrode of the first transistor TR1 is connected to the second source/drain electrode of the second transistor TR2 and the second electrode of the storage capacitor Cst. The first source/drain electrode of the first transistor TR1 is connected to the first power line ELVDL. The second source/drain electrode of the first transistor TR1 is connected to an anode electrode (or pixel electrode) of the light emitting element OLED. The first transistor TR1 receives a data signal Dj (j is an integer of 1 or more) according to a switching operation of the second transistor TR2 to supply a driving current to the light emitting element OLED.

The gate electrode of the second transistor TR2 is connected to the scan line SL. The first source/drain electrode of the second transistor TR2 is connected to the data line DL. The second source/drain electrode of the second transistor TR2 is connected to the gate electrode of the first transistor TR1 and the second electrode of the storage capacitor Cst. The second transistor TR2 is turned on according to the scan signal Sk (k is an integer of 1 or more) to perform a switching operation of transmitting the data signal Dj (j is an integer of 1 or more) to the gate electrode of the first transistor TR1.

The first electrode of the storage capacitor Cst may be connected to the first power line ELVDL and the first source/drain electrode of the first transistor TR1, and the second electrode of the storage capacitor Cst may be connected to the gate electrode of the first transistor TR1 and the second source/drain electrode of the second transistor TR2. The storage capacitor Cst may serve to keep constant the data voltage applied to the gate electrode of the first transistor TR1.

The light emitting element OLED may emit light according to the driving current of the first transistor TR1. The light emitting element OLED may be an organic light emitting diode including an anode electrode (or a first electrode), an organic light emitting layer and a cathode electrode (or a second electrode). However, the type of the light emitting element OLED according to the invention is not limited thereto. The anode electrode of the light emitting element OLED may be connected to the second source/drain electrode of the first transistor TR1, and the cathode electrode of the light emitting element OLED may be connected to the second power line ELVSL to which the second source voltage ELVSS lower than the first source voltage ELVDD is applied.

Hereinafter, the planar arrangement and the cross-sectional structure of the above-described pixels PX will be described in detail.

Figure 4:
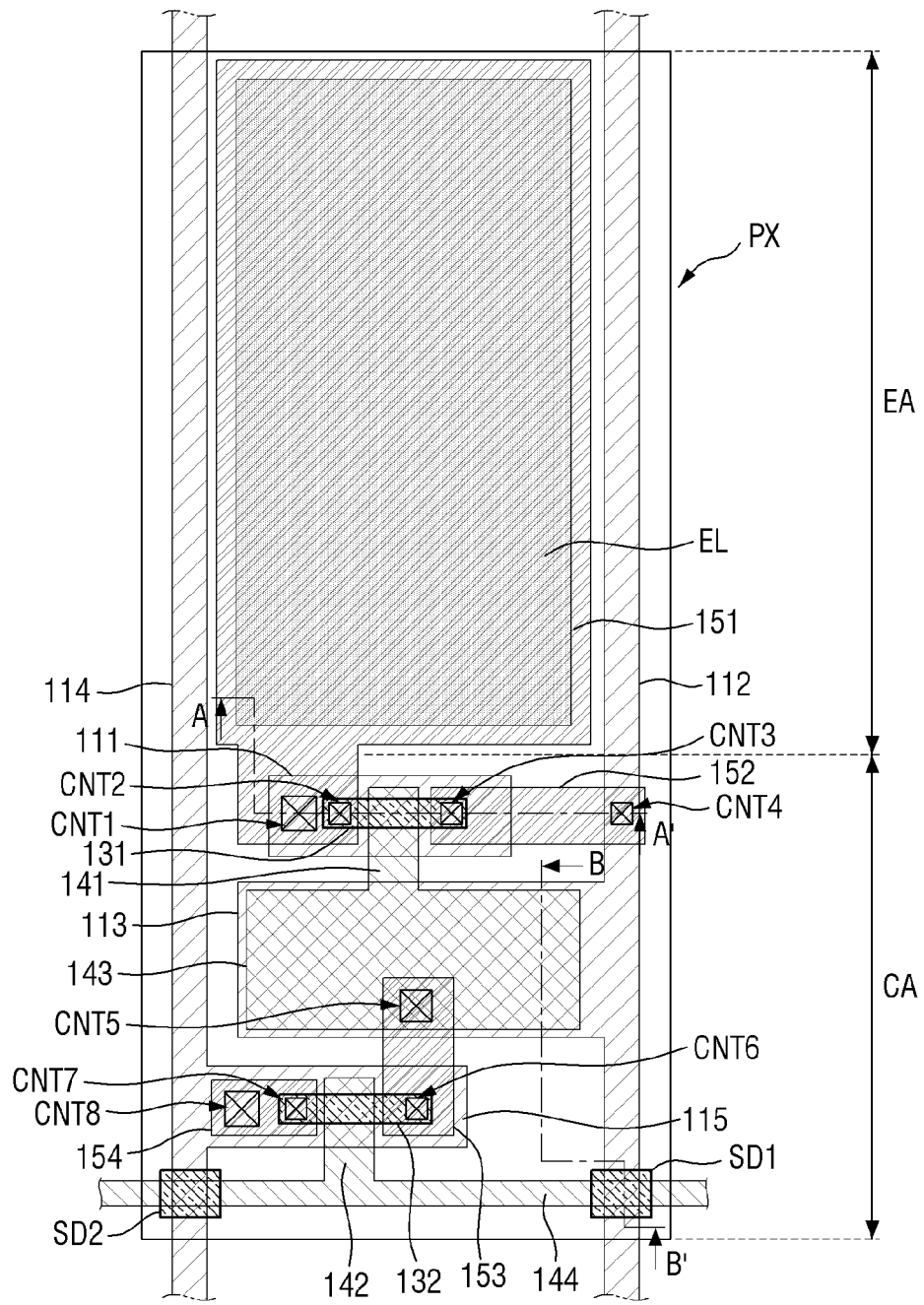
FIG. 4 is a layout diagram of one pixel of a display device according to an exemplary embodiment.
Figure 5:
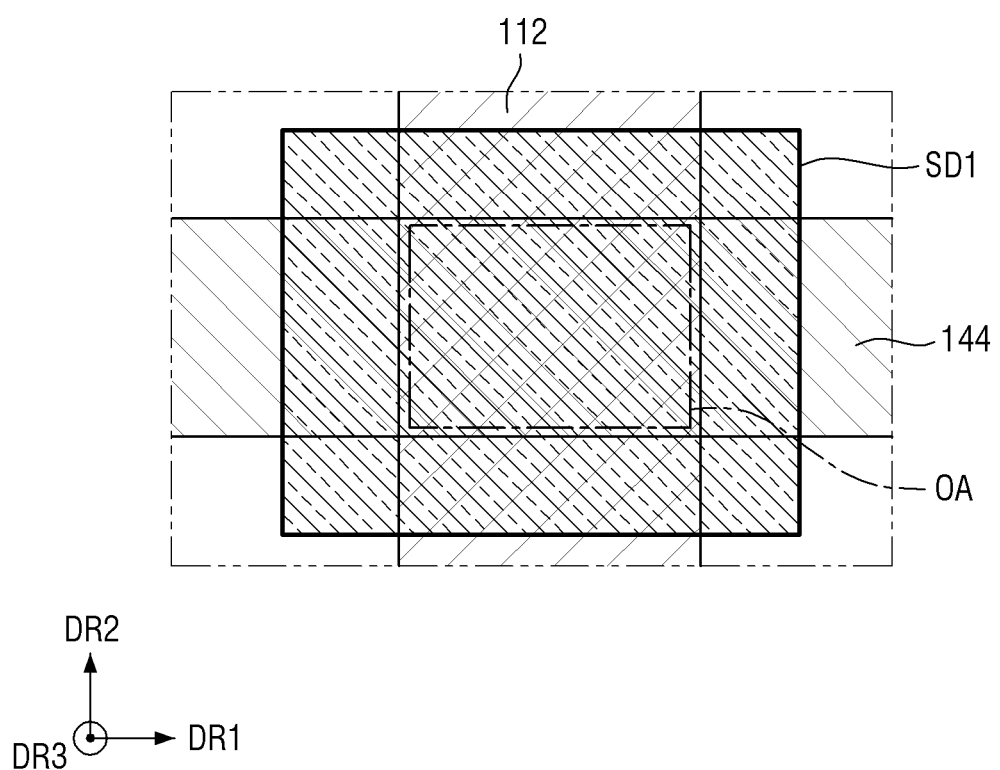
FIG. 5 is an enlarged view of a peripheral region of a first semiconductor dummy pattern of FIG. 4.
Figure 6:
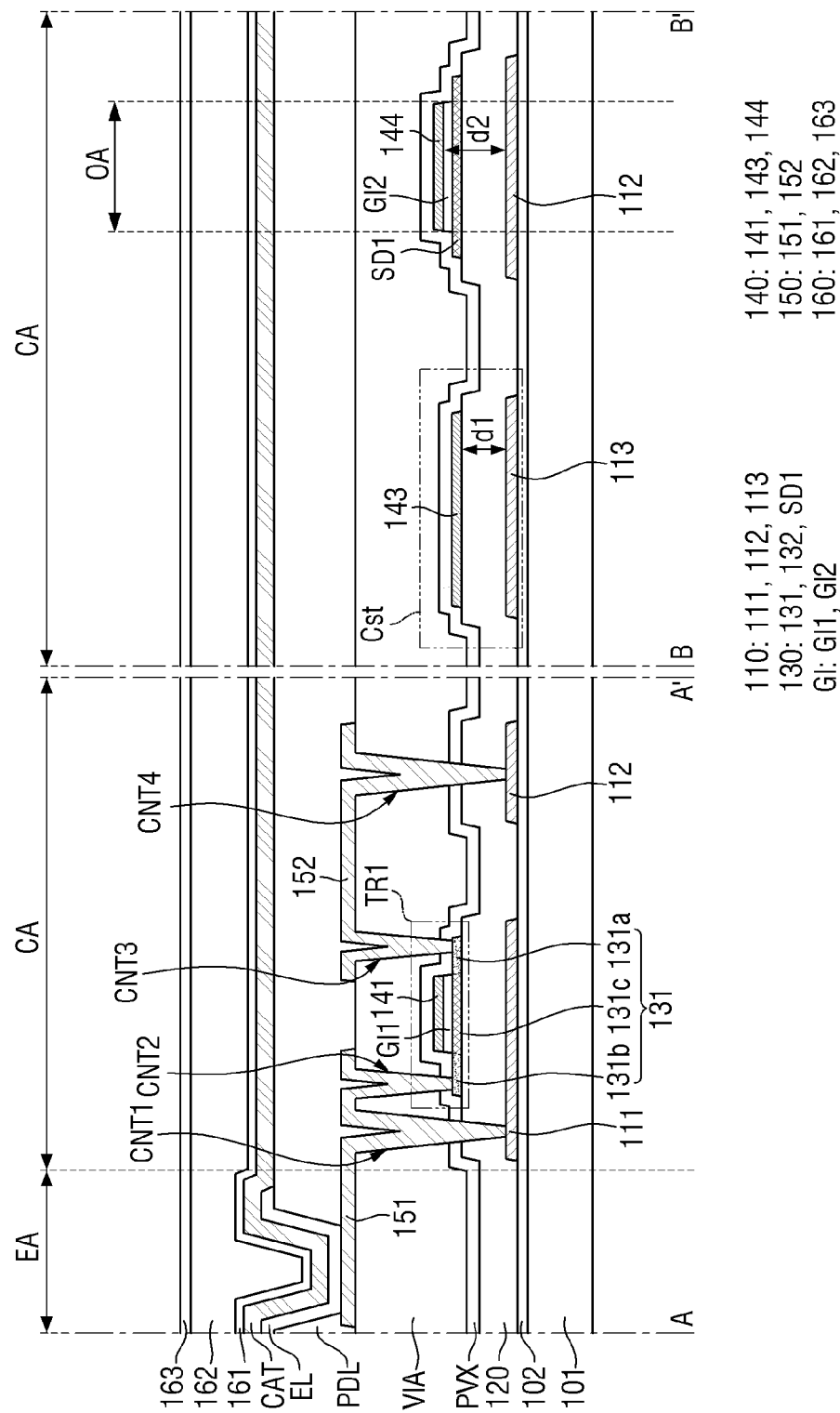
FIG. 6 is a cross-sectional view taken along lines A-A' and B-B' of FIG. 4.

FIG. 4 is a layout diagram of one pixel of a display device according to an exemplary embodiment. FIG. 5 is an enlarged view of a peripheral region of a first semiconductor dummy pattern of FIG. 4. FIG. 6 is a cross-sectional view taken along lines A-A' and B-B' of FIG. 4.

In the following embodiments, some of the elements are denoted by new reference numerals to facilitate a description of the arrangement and coupling relationship between the elements even though they are substantially the same as the elements mentioned with reference to FIGS. 1 to 3.

Referring to FIGS. 4 to 6, one pixel PX may include a light emission area EA and a circuit area CA. The light emission area EA is an area in which the light emitting element OLED is disposed to emit light. The circuit area CA includes a first transistor ('TR1' in FIG. 3, hereinafter the same) electrically connected to the first power line ('ELVDL' in FIG. 3, hereinafter 112), the data line ('DL' in FIG. 3, hereinafter 114) and the scan line ('SL' in FIG. 3, hereinafter 144), a second transistor ('TR2' in FIG. 3, hereinafter the same), and a capacitor ('Cst' in FIG. 3, hereinafter the same).

Each of the transistors TR1 and TR2 includes a conductive layer forming an electrode, a semiconductor pattern forming a channel, and an insulating layer. The storage capacitor Cst includes conductive layers forming an electrode and an insulating layer disposed between the conductive layers. Specifically, the storage capacitor Cst includes a first electrode 113 (or a lower electrode of the capacitor) of the storage capacitor Cst and a second electrode 143 (or an upper electrode of the capacitor) of the storage capacitor Cst and an insulating layer disposed therebetween. The above-described conductive material, conductive layer, semiconductor layer, and insulating layer are disposed on a base substrate 101.

The display panel 10 according to an exemplary embodiment includes a semiconductor layer 130, a plurality of conductive layers and a plurality of insulating layers disposed on the base substrate 101. The plurality of conductive layers may include a first conductive layer 110, a second conductive layer 140, and a third conductive layer 150. The plurality of insulating layers may include a buffer layer 120, a gate insulating layer GI, a passivation layer PVX and a via layer VIA. The respective layers of the display panel 10 may include a barrier layer 102, the first conductive layer 110, the buffer layer 120, the semiconductor layer 130, the gate insulating layer GI, the second conductive layer 140, the passivation layer PVX, the via layer VIA, the third conductive layer 150 and a pixel defining layer PDL, which are disposed on the base substrate 101 in this order. Each of the layers described above may consist of a single layer, or a stack of multiple layers. Other layers may be further disposed between the layers.

The base substrate 101 supports the respective layers disposed thereon. The base substrate 101 may be made of, for example, an insulating material such as a polymer resin. Examples of a polymer material may include polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), or a combination thereof. The base substrate 101 may include a metal material.

The base substrate 101 may be a flexible substrate which can be bent, folded or rolled. An example of the material of the flexible substrate may be polyimide (PI), but the invention is not limited thereto.

A transparent substrate may be used when the organic light emitting display device is a bottom emission type or a double-sided emission type. When the organic light emitting display device is a top emission type, in addition to a transparent substrate, a translucent or opaque substrate may be applied.

The barrier layer 102 may be disposed on the base substrate 101. The barrier layer 102 can prevent diffusion of impurity ions, prevent penetration of moisture or external air, and perform a surface planarization function. The barrier layer 102 may include silicon nitride, silicon oxide, silicon oxynitride, or the like. The barrier layer 102 may be omitted, depending on the type of the base substrate 101, process conditions, and the like.

The first conductive layer 110 is disposed on the barrier layer 102. However, without being limited thereto, when the barrier layer 102 is omitted, the first conductive layer 110 may be directly disposed on the base substrate 101.

The first conductive layer 110 includes a first lower light blocking pattern 111, a first power line 112, the first electrode 113 of the storage capacitor Cst, the data line 114, and a second lower light blocking pattern 115.

The first lower light blocking pattern 111 may serve to prevent light incident from the bottom side of the display panel 10 from entering a semiconductor pattern 131 of the first transistor TR1, particularly, a channel region 131c of the semiconductor pattern 131, disposed thereabove. The first lower light blocking pattern 111 may be disposed to cover the semiconductor pattern 131 of the first transistor TR1 disposed thereabove. The first lower light blocking pattern 111 may be larger than the semiconductor pattern 131 of the first transistor TR1 in the plan view, and the entire area of the semiconductor pattern 131 of the first transistor TR1 may overlap the first lower light blocking pattern 111 in the thickness direction (third direction DR3). However, without being limited thereto, the first lower light blocking pattern 111 may be disposed to cover at least the channel region 131c of the semiconductor pattern 131 of the first transistor TR1, and may overlap at least the channel region 131c of the semiconductor pattern 131 of the first transistor TR1. Further, the first lower light blocking pattern 111 may be smaller than the semiconductor pattern 131 of the first transistor TR1 in another exemplary embodiment.

The first lower light blocking pattern 111 is disposed between the first power line 112 and the data line 114 and may have an island shape. That is, the first lower light blocking pattern 111 may be spaced apart from the second lower light blocking pattern 115, the first power line 112, the first electrode 113 and the data line 114 of the storage capacitor Cst.

The first power line 112 may be disposed on the right side of one pixel PX in the plan view. The first power line 112 may extend in the second direction DR2. The first power line 112 may extend to another pixel PX located adjacent to one pixel PX in the second direction DR2.

The first electrode 113 of the storage capacitor Cst may protrude in the first direction DR1 from one side of the first power line 112. That is, the first electrode 113 of the storage capacitor Cst may be branched from the first power line 112 and may extend in the first direction DR1, exactly saying, a direction opposite to the arrow direction of the first direction DR1. The first electrode 113 of the storage capacitor Cst may be disposed near the center of the circuit area CA. The first electrode 113 of the storage capacitor Cst may be disposed between the first lower light blocking pattern 111 and the second lower light blocking pattern 115 (See FIG. 4). However, the arrangement position of the first electrode 113 of the storage capacitor Cst according to the invention is not limited thereto.

The data line 114 is disposed on the left side of one pixel PX in the plan view and may extend in the second direction DR2. The data line 114 may extend to another pixel PX located adjacent to one pixel PX in the second direction DR2. The data line 114 may be disposed on the left side of the first power line 112 while being spaced apart from the first power line 112.

The second lower light blocking pattern 115 may serve to prevent light incident from the bottom side of the display panel 10 from entering a semiconductor pattern 132 of the second transistor TR2, particularly, a channel region (not shown) of the semiconductor pattern 132, disposed thereabove. The second lower light blocking pattern 115 may be disposed to cover the semiconductor pattern 132 of the second transistor TR2 disposed above the second lower light blocking pattern 115. The second lower light blocking pattern 115 may be larger than the semiconductor pattern 132 of the second transistor TR2 in the plan view, and the entire area of the semiconductor pattern 132 of the second transistor TR2 may overlap the second lower light blocking pattern 115 in the thickness direction (third direction DR3). However, the present disclosure is not limited thereto, and the second lower light blocking pattern 115 may be disposed to cover at least the channel region (not shown) of the semiconductor pattern 132 of the second transistor TR2, and may overlap at least the channel region (not shown) of the semiconductor pattern 132 of the second transistor TR2. Further, the second lower light blocking pattern 115 may be smaller than the semiconductor pattern 132 of the second transistor TR2 in another exemplary embodiment.

The second lower light blocking pattern 115 may protrude in the first direction DR1 from one side of the data line 114. That is, the second lower light blocking pattern 115 may be branched from the data line 114 and may extend in the first direction DR1.

The first conductive layer 110 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer 110 may be a single layer or a multilayer.

The buffer layer 120 is disposed on the first conductive layer 110. The buffer layer 120 may serve as an interlayer insulating layer that insulates the first conductive layer 110 from the semiconductor layer 130. The buffer layer 120 may include at least one of silicon nitride, silicon oxide, or silicon oxynitride. The buffer layer 120 may be omitted depending on the type of the base substrate 101, process conditions, and the like.

The semiconductor layer 130 may be disposed on the buffer layer 120. The semiconductor layer 130 may include the semiconductor pattern 131 of the first transistor TR1, the semiconductor pattern 132 of the second transistor TR2, a first semiconductor dummy pattern S131 and a second semiconductor dummy pattern SD2.

The semiconductor pattern 131 of the first transistor TR1 may be an active layer of the first transistor TR1, and the semiconductor pattern 132 of the second transistor TR2 may be an active layer of the second transistor TR2. The semiconductor pattern 131 of the first transistor TR1 and the semiconductor pattern 132 of the second transistor TR2 may be arranged for each pixel PX.

The semiconductor pattern 131 of the first transistor TR1 and the semiconductor pattern 132 of the second transistor TR2 may extend in the first direction DR1 and may be spaced apart from each other. The semiconductor pattern 131 of the first transistor TR1 and the semiconductor pattern 132 of the second transistor TR2 may have an island shape. However, without being limited thereto, the semiconductor pattern 131 of the first transistor TR1 and/or the semiconductor pattern 132 of the second transistor TR2 may extend in the second direction DR2 in another exemplary embodiment.

The semiconductor pattern 131 of the first transistor TR1 may include the channel region 131c of the first transistor TR1 disposed to overlap the gate electrode 141 of the first transistor TR1 located thereabove in the thickness direction, and a first source/drain region 131a of the first transistor TR1 located on one side of the channel region 131c and a second source/drain region 131b of the first transistor TR1 located on the other side of the channel region 131c. The first and second source/drain regions 131a and 131b of the first transistor TR1 are conductive regions, and may have greater conductivity and lower electrical resistance than the channel region 131c of the first transistor TR1.

The first semiconductor dummy pattern SD1 may be disposed in a region (hereinafter, overlap region OA) in which the first power line 112 and the scan line 144 intersect and overlap each other. The second semiconductor dummy pattern SD2 may be disposed in a region (overlap region OA) in which the data line 114 and the scan line 144 intersect and overlap each other. Hereinafter, a partial description will be given in conjunction with the first semiconductor dummy pattern SD1, the first power line 112, and the scan line 144, but the above description also applies to the second semiconductor dummy pattern SD2, the data line 114, and the scan line 144.

The first semiconductor dummy pattern SD1 and the second semiconductor dummy pattern SD2 may have an island shape. That is, the first semiconductor dummy pattern SD1 and the second semiconductor dummy pattern SD2 may be disposed separately from each other, and may be disposed separately from the semiconductor pattern 131 of the first transistor TR1 and the semiconductor pattern 132 of the second transistor TR2.

The first semiconductor dummy pattern SD1 and the second semiconductor dummy pattern SD2 may be dummy semiconductor patterns isolated from a signal line (e.g., the first power line 112, the data line 114 and the scan line 144) or an electrode. That is, separate voltages may not be applied to the first semiconductor dummy pattern SD1 and the second semiconductor dummy pattern SD2.

The overlap region OA refers to a region where the first power line 112 extending in the second direction DR2 and the scan line 144 extending in the first direction DR1 overlap each other. The first power line 112 and the scan line 144 extending in different directions in the overlap region OA may cross each other. However, without being limited thereto, the first power line 112 and the scan line 144 may not cross each other or extend in the same direction while overlapping each other in the thickness direction (third direction DR3) in the overlap region OA in another exemplary embodiment.

FIG. 5 illustrates that the overlap region OA is formed inside a region where the first power line 112 and the scan line 144 actually overlap, but this is for convenience of illustration. The overlap region OA is a region where the first power line 112 and the scan line 144 overlap each other in the thickness direction (third direction DR3). In addition, although not shown in the drawings, the overlap region OA may refer to not only a region where the first power line 112 and the scan line 144 overlap in the thickness direction (third direction DR3), but also a region where the data line 114 and the scan line 144 overlap in the thickness direction (third direction DR3).

As the first semiconductor dummy pattern SD1 is disposed in the overlap region OA, the capacitance of a parasitic capacitor that may occur in the above-mentioned region may be reduced. The parasitic capacitor may include the first power line 112 as a first electrode, and the scan line 144 as a second electrode, and may include, as a dielectric, the buffer layer 120, the first semiconductor dummy pattern SD1 and a second gate insulating layer pattern GI2, between the first power line 112 and the scan line 144. As the first semiconductor dummy pattern SD1 is disposed in the overlap region OA, a distance d2 in the thickness direction (third direction DR3) between the first power line 112 and the scan line 144 may increase compared to the case that the first semiconductor dummy pattern SD1 does not exist.

When the parasitic capacitor is formed between the first power line 112 and the scan line 144, the dielectric of the parasitic capacitor and the dielectric of the storage capacitor Cst share the same configuration, but the dielectric (or dielectric layer) of the parasitic capacitor may include more layers than the dielectric (or dielectric layer) of the storage capacitor Cst. Although not limited thereto, for example, the dielectric of the storage capacitor Cst includes the buffer layer 120. However, when a parasitic capacitor is formed between the first power line 112 and the scan line 144 in the overlap region OA, the dielectric of the parasitic capacitor may further include the first semiconductor dummy pattern SD1 and the second gate insulating layer pattern GI2 as well as the buffer layer 120. That is, when a parasitic capacitor is formed in the overlap region OA, the dielectric of the storage capacitor Cst and the dielectric of the parasitic capacitor share the buffer layer 120, but the dielectric of the parasitic capacitor may further include the first semiconductor dummy pattern SD1 and the second gate insulating layer pattern GI2.

In this case, by arranging the first semiconductor dummy pattern SD1 and/or the second gate insulating layer pattern GI2 in the overlap region OA, it is possible to independently adjust the capacitance of the parasitic capacitor from the capacitance of the storage capacitor Cst. That is, by further disposing the first semiconductor dummy pattern SD1 and/or the second gate insulating layer pattern GI2 in the overlap region OA, a dielectric constant c of the dielectric of the parasitic capacitor and a distance d (or thickness of the dielectric) between the conductors can be adjusted independently of the storage capacitor Cst (See Equation (1) below).

The thickness of the dielectric of the storage capacitor Cst may be substantially the same as a thickness d1 (i.e., length in the third direction DR3) of the buffer layer 120, and the thickness of the dielectric of the parasitic capacitor may be substantially the same as the distance d2 (length in the third direction DR3) between the first power line 112 and the scan line 144 in the overlap region OA. Therefore, by disposing the first semiconductor dummy pattern SD1 and/or the second gate insulating layer pattern GI2 in the overlap region OA, the thickness d2 of the dielectric of the parasitic capacitor may be greater than the thickness d1 of the dielectric of the storage capacitor Cst.

In addition, by disposing the first semiconductor dummy pattern SD1 and/or the second gate insulating layer pattern GI2 in the overlap region OA, the dielectric constant of the dielectric of the parasitic capacitor may be smaller than that of the dielectric of the storage capacitor Cst.

A capacitance C of the capacitor may be inversely proportional to a distance d (or a thickness of the dielectric) between conductors, and may be proportional to a dielectric constant E of the dielectric and an overlapping area S between the conductors as represented in the following Equation (1):

$$C = \varepsilon \times \frac{S}{d} \quad (1)$$

Therefore, in the overlap region OA, by further arranging the first semiconductor dummy pattern SD1 and/or the second gate insulating layer pattern GI2 between the first power line 112 and the scan line 144 in the thickness direction (third direction DR3), it is possible to increase the thickness of the dielectric of the parasitic capacitor, and/or decrease the dielectric constant of the dielectric of the parasitic capacitor. Therefore, it is possible to reduce the capacitance of the parasitic capacitor.

Since the first semiconductor dummy pattern SD1 and the second gate insulating layer pattern GI2 are further disposed only in the overlap region OA and nearby area and not in the region of the storage capacitor Cst, the distance d1 (or the thickness of the dielectric of the storage capacitor Cst) between the first electrode 113 and the second electrode 143 of the storage capacitor Cst, and the dielectric constant of the dielectric in the storage capacitor Cst can be maintained. Accordingly, the capacitance of the storage capacitor Cst may be maintained at a sufficient level without decreasing, but the capacitance of the parasitic capacitor may be reduced.

The first semiconductor dummy pattern SD1 may cover at least a portion of the overlapped area OA. Although not limited thereto, the first semiconductor dummy pattern SD1 according to an exemplary embodiment may cover the entire overlap region OA where the first power line 112 and the scan line 144 overlap each other. In other words, the first semiconductor dummy pattern SD1 may be disposed over the entire area of the overlap region OA. The entire area of the overlap region OA may overlap the first semiconductor dummy pattern SD1 in the thickness direction (third direction DR3), but only a partial area of the first semiconductor dummy pattern SD1 may overlap the overlap region OA in the thickness direction (third direction DR3).

The first semiconductor dummy pattern SD1 may have a shape extended from the overlap region OA. In other words, in the plan view, the first semiconductor dummy pattern SD1 may have a larger size and area than the overlap region OA. In addition, the first semiconductor dummy pattern SD1 covering the entire area of the overlap region OA may partially protrude outward from the overlap region OA as shown in FIG. 5. The first semiconductor dummy pattern SD1 overlapping the entire area of the overlap region OA in the thickness direction (third direction DR3) may extend in the first direction DR1 and/or the second direction DR2 to protrude from the overlap region OA. The length of the first semiconductor dummy pattern SD1 in the first direction DR1 may be greater than or equal to the width of the first power line 112 in the first direction DR1. The length of the first semiconductor dummy pattern SD1 in the second direction DR2 may be greater than or equal to the width of the scan line 144 in the second direction DR2.

The planar shape of the first semiconductor dummy pattern SD1 may be a shape corresponding to the planar shape of the overlap region OA. The overlap region OA may be disposed in a rectangular shape in the plan view, and the first semiconductor dummy pattern SD1 may have a rectangular shape in the plan view. However, without being limited thereto, although the overlap region OA has a rectangular shape in the plan view, the first semiconductor dummy pattern SD1 may have a polygonal shape such as a triangle or a pentagon, or a circular or elliptical shape while covering the entire area of the overlap region OA in another exemplary embodiment.

In addition, as will be described later, the first semiconductor dummy pattern SD1 and the second semiconductor dummy pattern SD2 may be formed together in a process of forming the semiconductor layer 130. Therefore, a process for forming the first semiconductor dummy pattern SD1 and the second semiconductor dummy pattern SD2 is not further explained.

The semiconductor layer 130 may include an oxide semiconductor. The oxide semiconductor may include, for example, a binary compound (ABx), a ternary compound (ABxCy), or a quaternary compound (ABxCyDz) including indium (In), zinc (Zn), gallium (Ga), tin (Sn), titanium (Ti), aluminum (Al), hafnium (Hf), zirconium (Zr), magnesium (Mg) and the like. In an exemplary embodiment, the semiconductor layer 130 may include indium tin zinc oxide ("IGZO"). However, without being limited thereto, the semiconductor layer 130 may be made of polycrystalline silicon, monocrystalline silicon, or amorphous silicon.

The gate insulating layer GI is disposed on the semiconductor layer 130. The gate insulating layer GI may include a first gate insulating layer pattern GI1 and a second gate insulating layer pattern GI2. The gate insulating layer pattern GI1 may cover the channel region 131c (not shown) of the semiconductor layer 130 and may expose the first and second source/drain regions 131a and 131b, and the side surfaces of the semiconductor layer 130. The first gate insulating layer pattern GI1 may serve as a gate insulating layer of the first transistor TR1 in some regions. The second gate insulating layer pattern GI2 may serve as a dielectric of the parasitic capacitor in the overlap region OA. In addition, although not illustrated, a third gate insulating layer pattern (not shown) may serve as a gate insulating layer of the transistor TR2.

The first gate insulating layer pattern GI1 may overlap the gate electrode 141 of the first transistor TR1 thereabove. The second gate insulating layer pattern GI2 may overlap the scan line 144 thereabove and may overlap the first semiconductor dummy pattern SD1 and the second semiconductor dummy pattern SD2 therebelow. The gate insulating layer GI may not be disposed between the first electrode 113 and the second electrode 143 of the storage capacitor Cst. Accordingly, the distance d1 between the first electrode 113 and the second electrode 143 of the storage capacitor Cst can be reduced, and the capacitance of the storage capacitor Cst can be increased.

By disposing the second gate insulating layer pattern GI2 in the overlap region OA, when the parasitic capacitor is formed between the first power line 112 and the scan line 144 in the overlap region OA, the capacitance of the parasitic capacitor can be reduced. Since the second gate insulating layer pattern GI2 is disposed only in the overlap region OA and nearby area and not in the region of the storage capacitor Cst, the distance d1 (or the thickness of the dielectric of the storage capacitor Cst) between the first electrode 113 and the second electrode 143 of the storage capacitor Cst may be maintained, so that the capacitance of the storage capacitor Cst may not decrease. That is, by further arranging the second gate insulating layer pattern GI2 between the first power line 112 and the scan line 144 in the overlap region OA, the capacitance of the parasitic capacitor can be reduced while maintaining the capacitance of the storage capacitor Cst.

The second gate insulating layer pattern GI2 may be formed together in a process of forming the gate insulating layer GI. Therefore, a process for forming the second gate insulating layer pattern GI2 is not explained separately.

The gate insulating layer GI may include a silicon compound, a metal oxide, or the like. For example, the gate insulating layer GI may include silicon oxide, silicon nitride, silicon oxynitride, aluminum oxide, tantalum oxide, hafnium oxide, zirconium oxide, titanium oxide, or the like. These may be used alone or in combination with each other.

The second conductive layer 140 is disposed on the gate insulating layer GI. The second conductive layer 140 may include the gate electrode 141 of the first transistor TR1, the gate electrode 142 of the second transistor TR2, the second electrode 143 (or the upper electrode) of the storage capacitor Cst, and the scan line ('SL' in FIG. 3, hereinafter 144).

Although not limited thereto, the gate electrode 141 of the first transistor TR1 may protrude in the second direction DR2 from one side of the second electrode 143 of the storage capacitor Cst (See FIG. 4). The gate electrode 141 of the first transistor TR1 may be branched in the second direction DR2 from the second electrode 143 of the storage capacitor Cst, and may be disposed to overlap the channel region 131c of the semiconductor pattern 131 of the first transistor TR1. The gate electrode 142 of the second transistor TR2 may protrude from one side of the scan line 144. The gate electrode 142 of the second transistor TR2 may be branched from the scan line 144 in the second direction DR2 and may be disposed to overlap the channel region (not shown) of the semiconductor pattern 132 of the second transistor TR2.

The second electrode 143 of the storage capacitor Cst may be disposed at the center of the circuit area CA, may be located between the first lower light blocking pattern 111 and the second lower light blocking pattern 115 in the plan view, and may partially extend to be connected to the gate electrode 141 of the first transistor TR1.

The second electrode 143 of the storage capacitor Cst may be disposed on the first electrode 113 of the storage capacitor Cst to overlap at least a portion of the first electrode 113 of the storage capacitor Cst. The shape of the second electrode 143 of the storage capacitor Cst may be substantially similar to the shape of the first electrode 113 of storage capacitor Cst. The second electrode 143 of the storage capacitor Cst may have an area smaller than the area of the first electrode 113 of the storage capacitor Cst to expose a portion of the first electrode 113 of the storage capacitor Cst in the plan view.

The second electrode 143 of the storage capacitor Cst may be disposed to overlap the first electrode 113 of the storage capacitor Cst with the buffer layer 120 interposed therebetween, thereby forming the storage capacitor Cst. The buffer layer 120 interposed between the first electrode 113 of the storage capacitor Cst and the second electrode 143 of the storage capacitor Cst may be a dielectric of the storage capacitor Cst.

Although not limited thereto, the second electrode 143 of the storage capacitor Cst and the gate electrode 141 of the first transistor TR1 may be integrally formed into a monolithic pattern as the second conductive layer 140.

The scan line 144 may be disposed below one pixel PX (or below the circuit area CA) in the plan view. The scan line 144 may extend in the first direction DR1. The scan line 144 may extend to another pixel PX located adjacent to one pixel PX in the first direction DR1. The scan line 144 may be disposed on a different layer from the first power line 112 and the data line 114, and may be disposed above the first power line 112 and the data line 114. The scan line 144 may extend in the first direction DR1 and intersect the first power line 112 and the data line 114 extending in the second direction DR2.

The second conductive layer 140 may be made of a low resistance material. The second conductive layer 140 may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu), but is not limited thereto.

The passivation layer PVX is disposed on the second conductive layer 140. The passivation layer PVX may cover and protect the second conductive layer 140. The passivation layer PVX may cover the top surface and/or side surface of the gate insulating layer GI as well as the top and side surfaces of the second conductive layer 140.

The passivation layer PVX may include an inorganic insulating material such as silicon oxide, silicon nitride, silicon oxynitride, hafnium oxide, aluminum oxide, titanium oxide, tantalum oxide, zinc oxide, or the like. Although not illustrated, the passivation layer PVX may be disposed in the display area DA, and may not be disposed in at least a part of the non-display area NDA.

The via layer VIA (i.e., planarization layer) is disposed on the passivation layer PVX. The via layer VIA may be disposed on the passivation layer PVX to completely cover the top surface of the passivation layer PVX. When the via layer VIA is made of an organic layer, the upper surface of the via layer VIA may be flat despite a lower surface's step.

The via layer VIA may include an inorganic insulating material or an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene ("BCB"). The via layer VIA may further include a photosensitive material, but the present disclosure according to the invention is not limited thereto.

The third conductive layer 150 is disposed on the via layer VIA. The third conductive layer may include a first conductive pattern 151, a second conductive pattern 152, a third conductive pattern 153 and a fourth conductive pattern 154. The conductive patterns 151, 152, 153 and 154 may be physically spaced apart from each other, but may electrically connect each other.

The first conductive pattern 151 may include an anode electrode of the light emitting element ('OLED' in FIG. 3). The first conductive pattern 151 may be disposed separately for each pixel. At least a portion of the first conductive pattern 151 may overlap the first lower light blocking pattern 111 and overlap the semiconductor pattern 131 of the first transistor TR1.

The first conductive pattern 151 may pass through the via layer VIA, the passivation layer PVX and the buffer layer 120, and may contact the first lower light blocking pattern 111 through a contact hole CNT1 exposing a portion of the first lower light blocking pattern 111. Further, the first conductive pattern 151 may pass through the via layer VIA and the passivation layer PVX, and may contact the second source/drain region 131b of the first transistor TR1 through a contact hole CNT2 exposing a portion of the second source/drain region 131b of the first transistor TR1. Accordingly, the first conductive pattern 151 itself may become the second source/drain electrode of the first transistor TR1, or at least a portion of the first conductive pattern 151 may become the second source/drain electrode of the first transistor TR1. In addition, the second source/drain region 131b of the first transistor TR1 and the first lower light blocking pattern 111 may be electrically connected to each other by the first conductive pattern 151.

The second conductive pattern 152 may overlap the first power line 112 and the semiconductor pattern 131 of the first transistor TR1. The second conductive pattern 152 may pass through the via layer VIA and the passivation layer PVX, and may contact the first source/drain region 131a of the first transistor TR1 through a contact hole CNT3 exposing a portion of the first source/drain region 131a of the first transistor TR1. Accordingly, the second conductive pattern 152 itself may become the first source/drain electrode of the first transistor TR1, or at least a portion of the second conductive pattern 152 may become the first source/drain electrode of the first transistor TR1. In addition, the second conductive pattern 152 may pass through the via layer VIA, the passivation layer PVX and the buffer layer 120, and may contact the first power line 112 through a contact hole CNT4 exposing a portion of the first power line 112. Thus, the first source/drain region 131a of the first transistor TR1 and the first power line 112 may be electrically connected to each other by the second conductive pattern 152.

The third conductive pattern 153 may overlap the first electrode 113 of the storage capacitor Cst, the second electrode 143 of the storage capacitor Cst, the semiconductor pattern 132 of the second transistor TR2, and the second lower light blocking pattern 115. The third conductive pattern 153 may contact the second electrode 143 of the storage capacitor Cst through a contact hole CNT5. Further, the third conductive pattern 153 may contact the second source/drain region of the second transistor TR2 through a contact hole CNT6. Accordingly, the third conductive pattern 153 itself may become the second source/drain electrode of the second transistor TR2, or at least a portion of the third conductive pattern 153 may become the second source/drain electrode of the second transistor TR2. In addition, the second electrode 143 of the storage capacitor Cst and the second source/drain region (not shown) of the second transistor TR2 may be electrically connected to each other by the third conductive pattern 153.

The fourth conductive pattern 154 may overlap the second lower light blocking pattern 115 and the semiconductor pattern 132 of the second transistor TR2. The fourth conductive pattern 154 may contact the first source/drain region of the second transistor TR2 through a contact hole CNT7. Accordingly, the fourth conductive pattern 154 itself may become the first source/drain electrode of the second transistor TR2, or at least a portion of the fourth conductive pattern 154 may become the first source/drain electrode of the second transistor TR2. Further, the fourth conductive pattern 154 may contact the second lower light blocking pattern 115 through a contact hole CNT8. Thus, the first source/drain region of the second transistor TR2 and the second lower light blocking pattern 115 may be electrically connected to each other by the fourth conductive pattern 154.

The third conductive layer 150 may have a stacked structure formed by stacking a material layer having a high work function, such as indium tin oxide ("ITO"), indium zinc oxide ("IZO"), zinc oxide (ZnO) and indium oxide (In2O3), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof, but the invention is not limited thereto. The layer having a high work function may be disposed above the reflective material layer and disposed closer to a light emitting layer EL. The third conductive layer 150 may have a multilayer structure such as ITO/Mg, ITO/MgF, ITO/Ag and ITO/Ag/ITO, but the invention is not limited thereto.

The pixel defining layer PDL may be disposed on the third conductive layer 150. The pixel defining layer PDL may define an opening partially exposing the first conductive pattern 151 of the third conductive layer 150. The pixel defining layer PDL may be formed of or include an organic insulating material or an inorganic insulating material. For example, the pixel defining layer PDL may include at least one of polyimide resin, acrylic resin, a silicon compound, or polyacrylic resin.

The light emitting layer EL, a cathode electrode CAT and a thin film encapsulation layer 160 may be further disposed on the first conductive pattern 151 exposed by the pixel defining layer PDL.

The light emitting layer EL may include an organic material layer. The organic material layer of the light emitting layer EL may include an organic light emitting layer, and may further include a hole injecting/transporting layer and/or an electron injecting/transporting layer.

The cathode electrode CAT may be disposed on the light emitting layer EL. The cathode electrode CAT may be a common electrode disposed on all pixels PX without distinction of pixels PX. The first conductive pattern 151 (i.e., the anode electrode), the light emitting layer EL and the cathode electrode CAT may constitute an organic light emitting element OLED.

The cathode electrode CAT may include a material layer having a low work function, such as Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg). The cathode electrode CAT may further include a transparent metal oxide layer disposed on the material layer having a low work function.

The thin film encapsulation layer 160 is disposed on the cathode electrode CAT. The thin film encapsulation layer 160 may include a first inorganic layer 161, a first organic layer 162 and a second inorganic layer 163. Although not illustrated, the first inorganic layer 161 and the second inorganic layer 163 may be in contact with each other at the end of the thin film encapsulation layer 160. The first organic layer 162 may be encapsulated by the first inorganic layer 161 and the second inorganic layer 163.

Each of the first inorganic layer 161 and the second inorganic layer 163 may include silicon nitride, silicon oxide, silicon oxynitride, or the like. The first organic layer 162 may include an organic insulating material.

Hereinafter, a method of fabricating the display device 1 according to an exemplary embodiment will be described.

Figure 7:
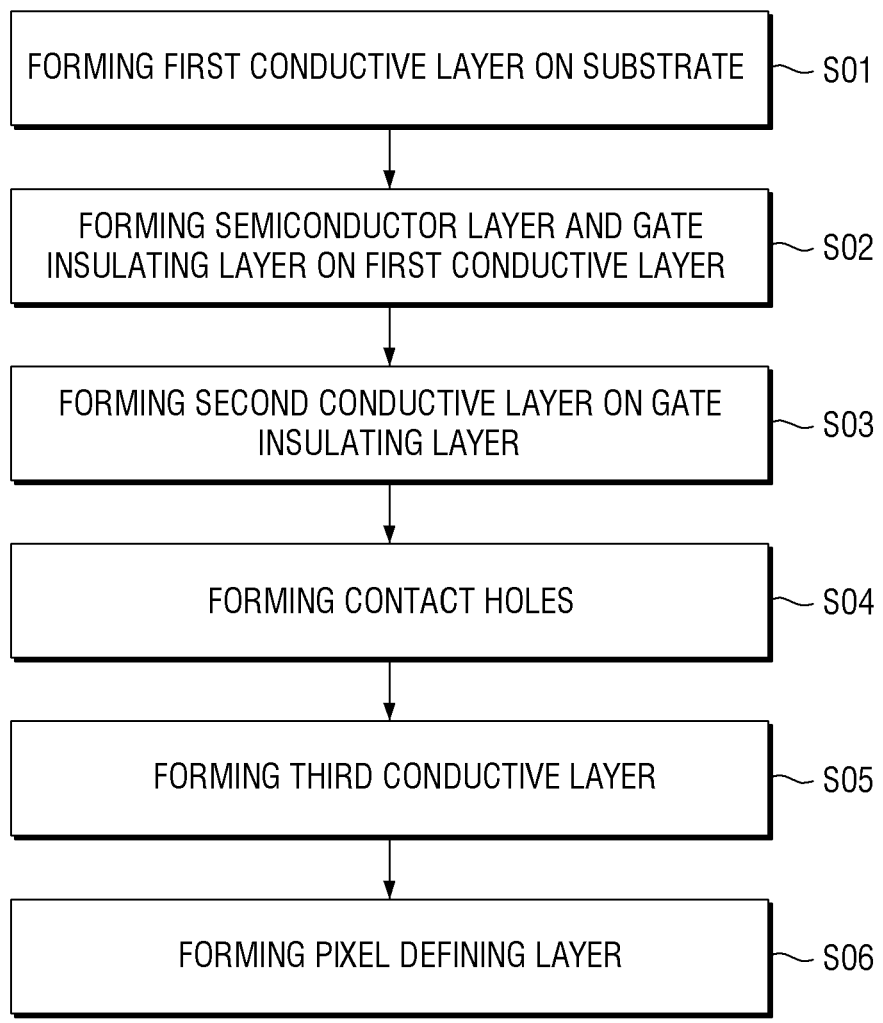
FIG. 7 is a flowchart of a method of fabricating a display device according to an exemplary embodiment.

FIG. 7 is a flowchart of a method of fabricating a display device according to an exemplary embodiment. FIGS. 8 to 19 are cross-sectional views showing the steps of a method of fabricating one pixel of the display device shown in FIG. 6.

Figure 8:
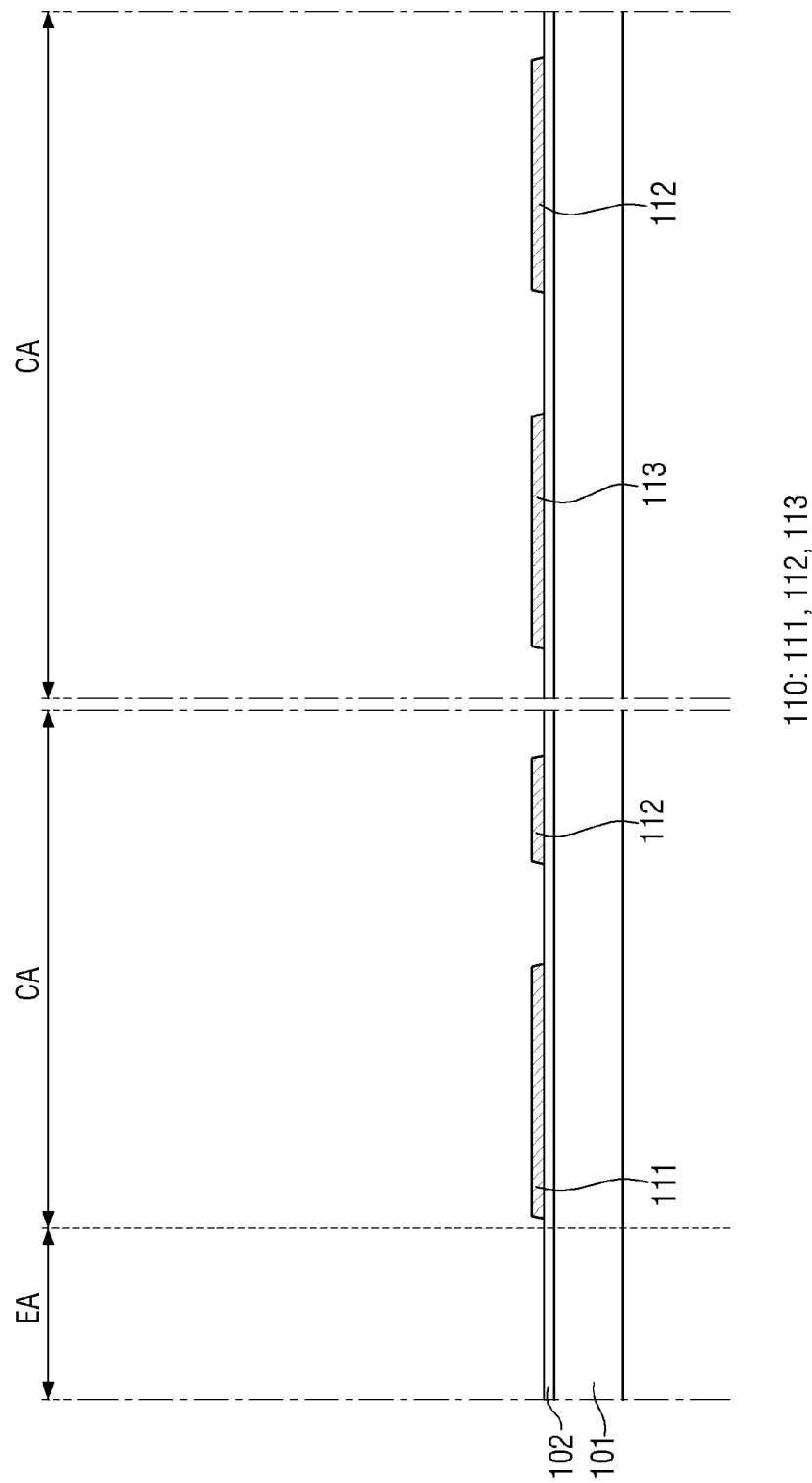
FIGS. 8 to 19 are cross-sectional views showing the steps of a method of fabricating one pixel of the display device shown in FIG. 6.
Figure 9:
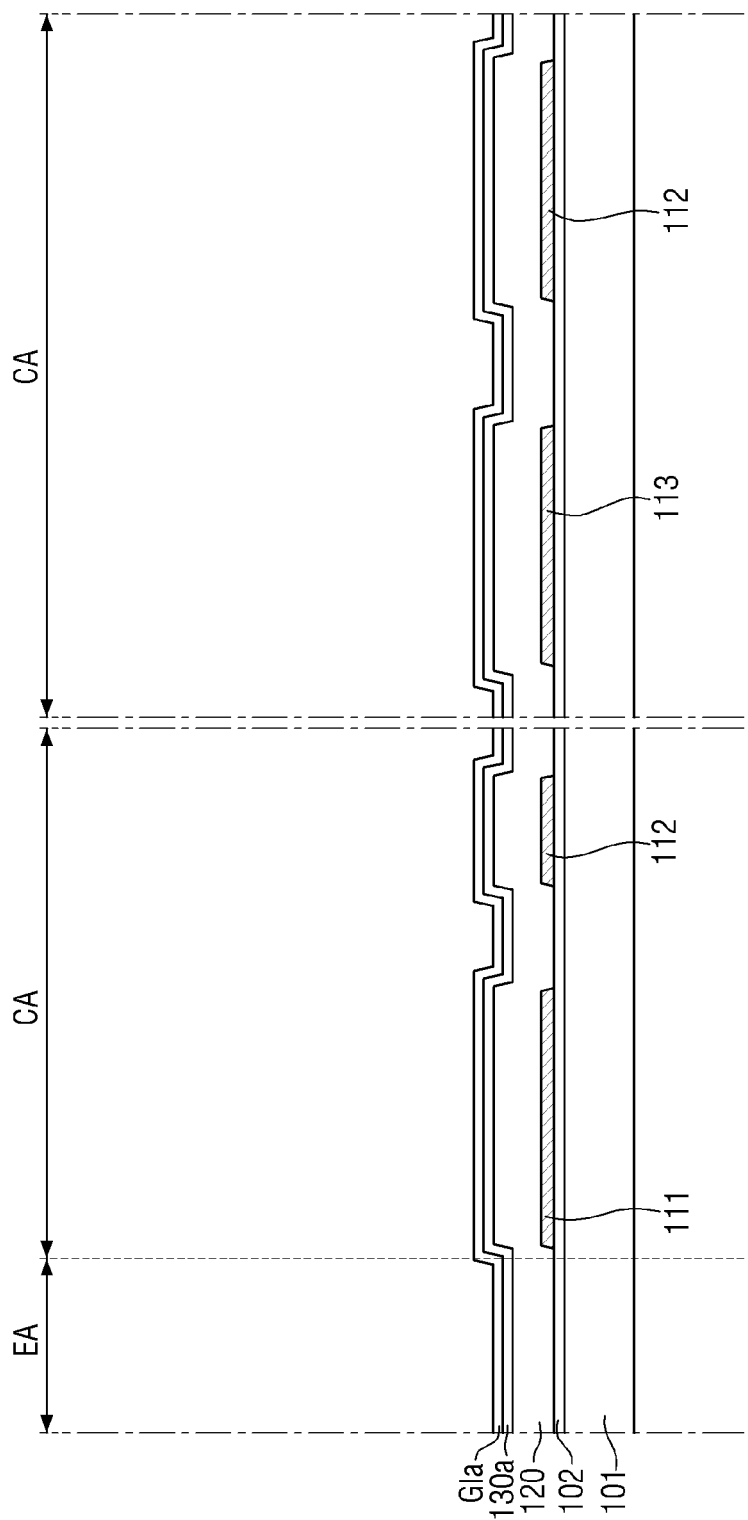
Figure 10:
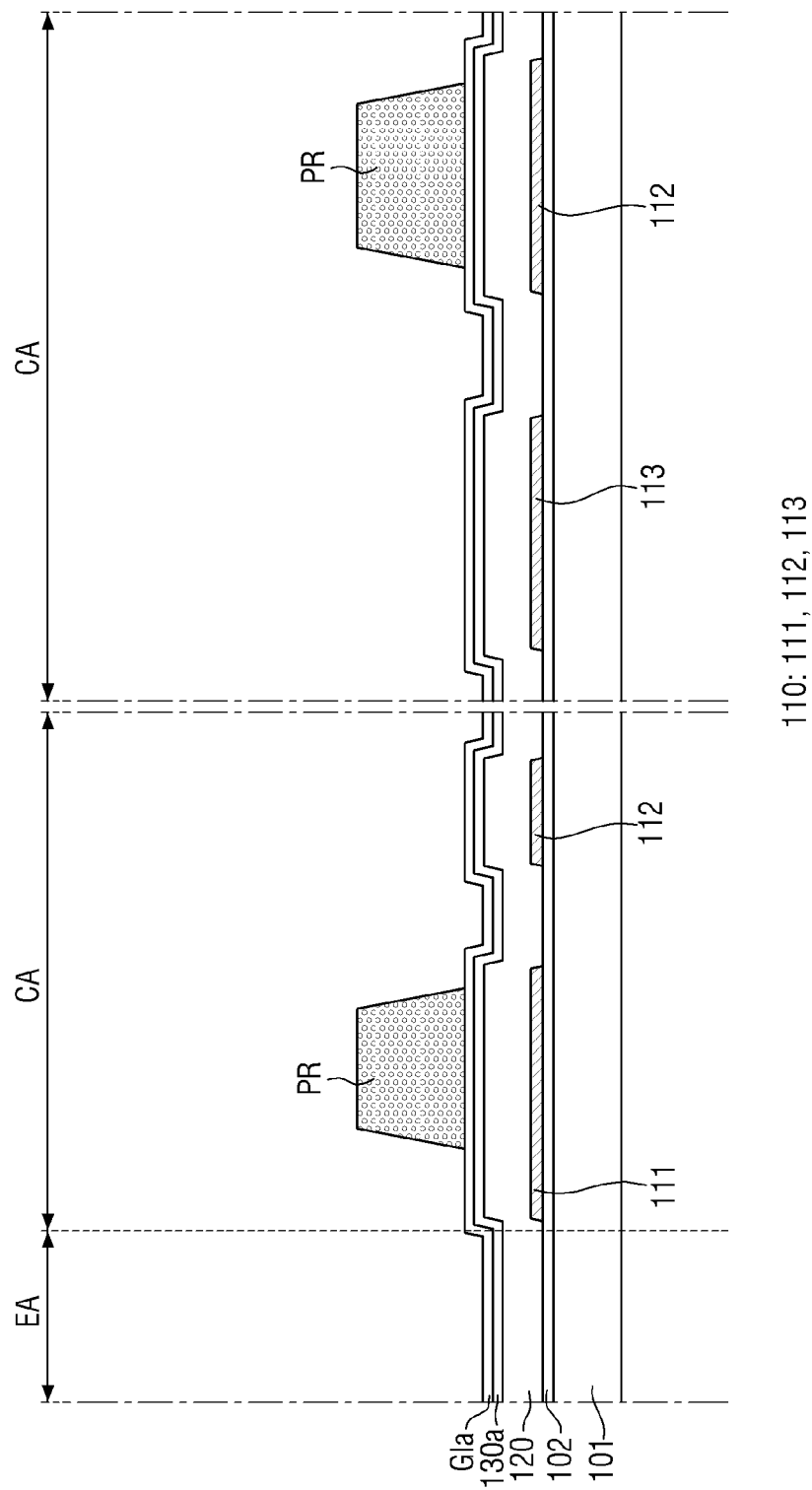
Figure 11:
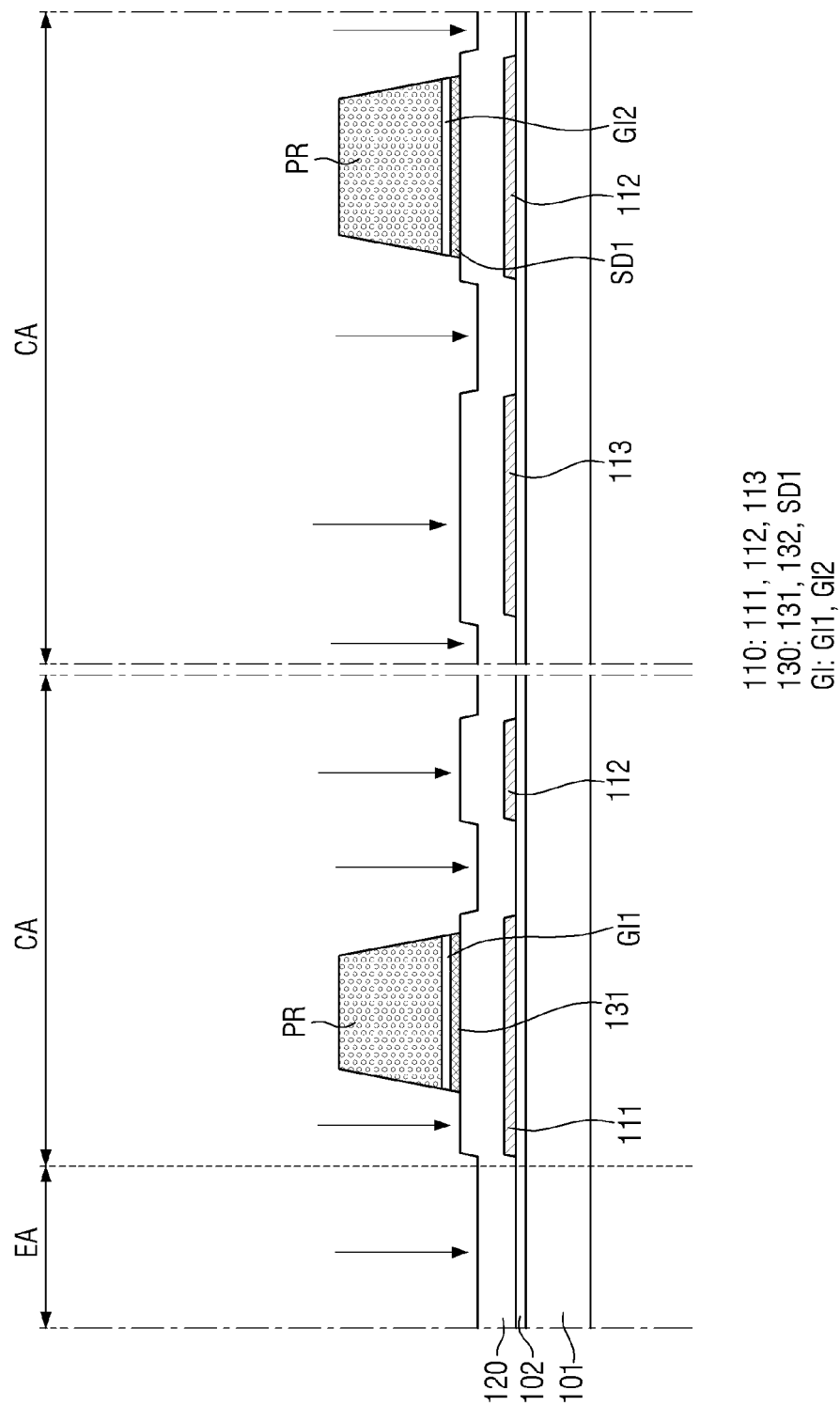
Figure 12:
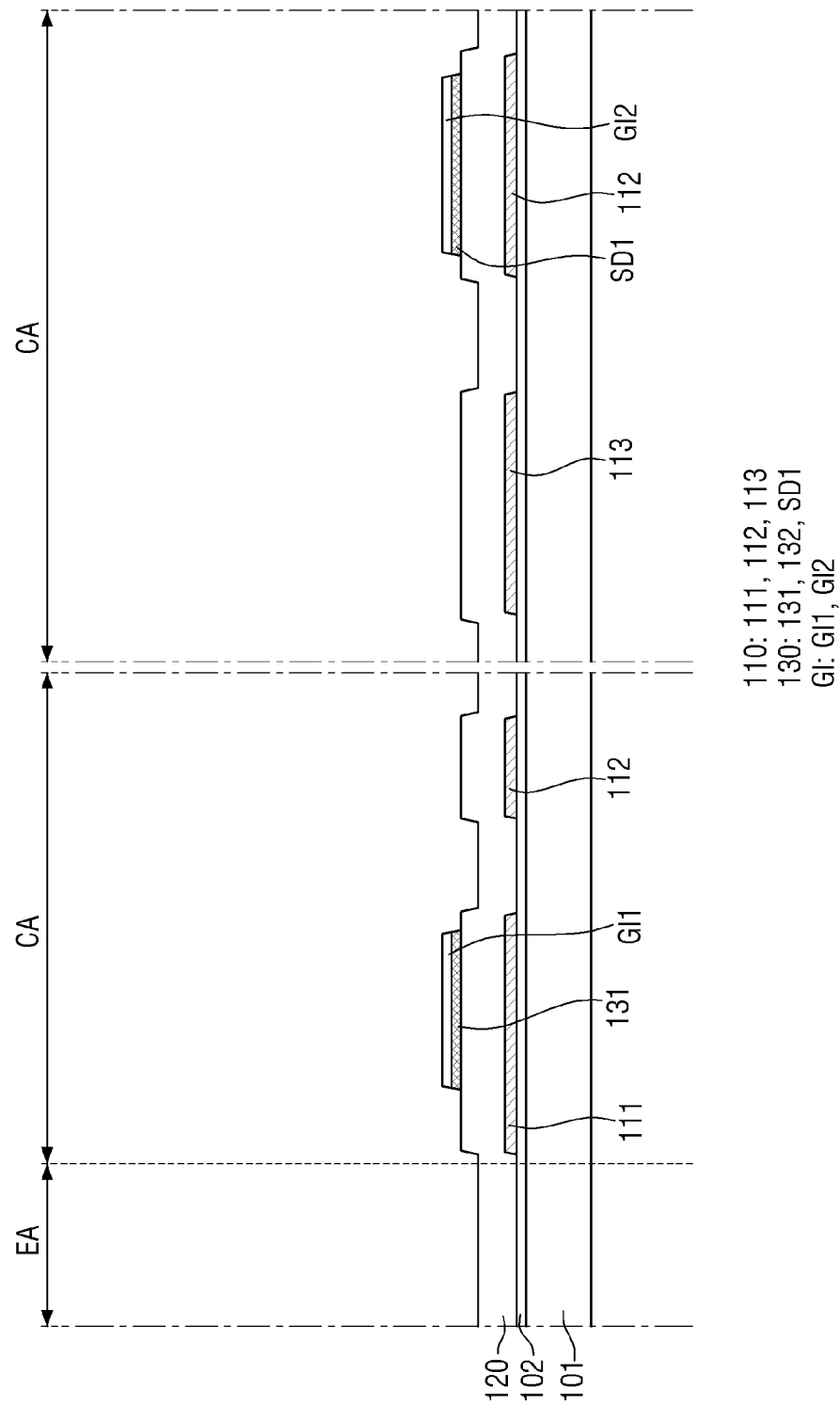
Figure 13:
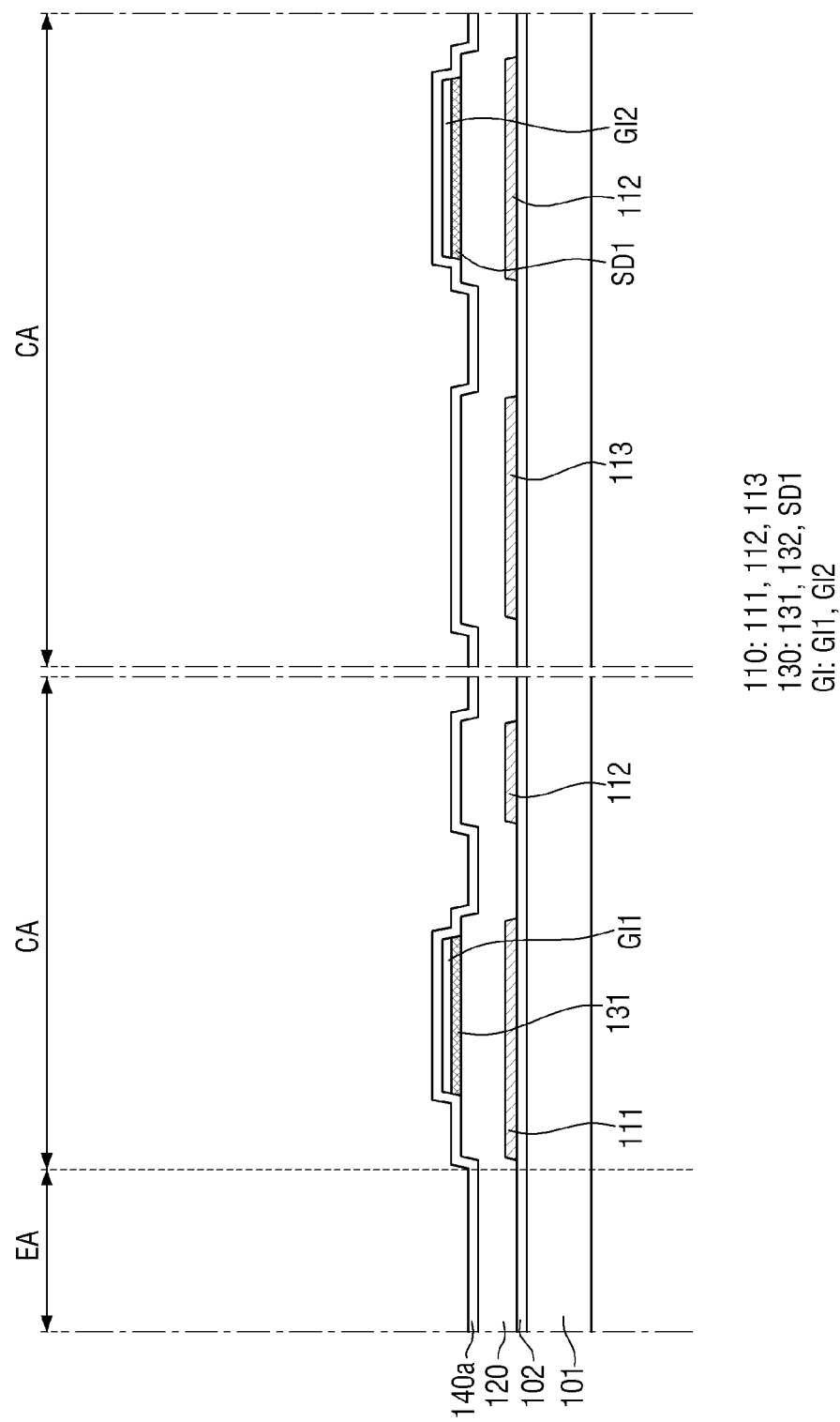
Figure 14:
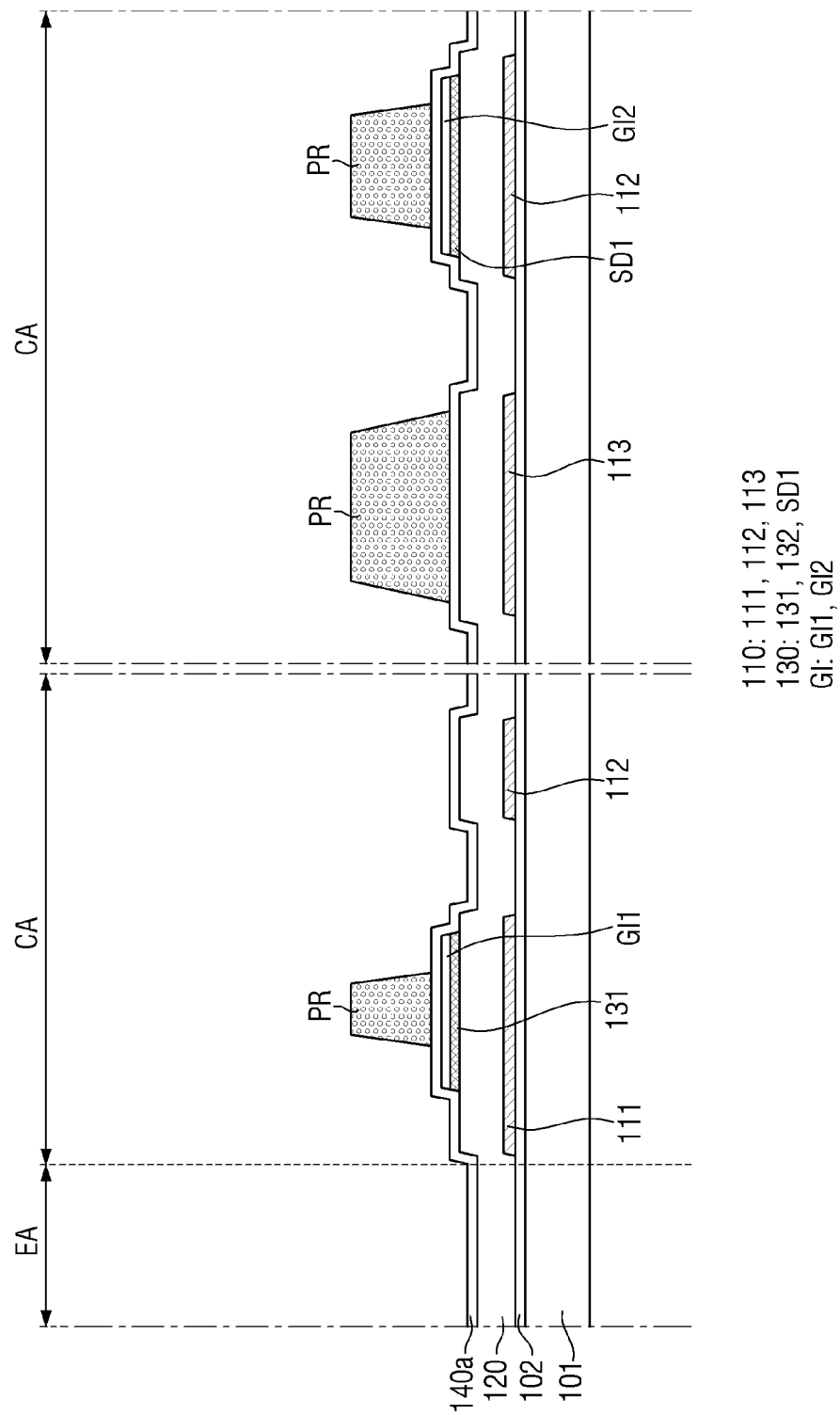
Figure 15:
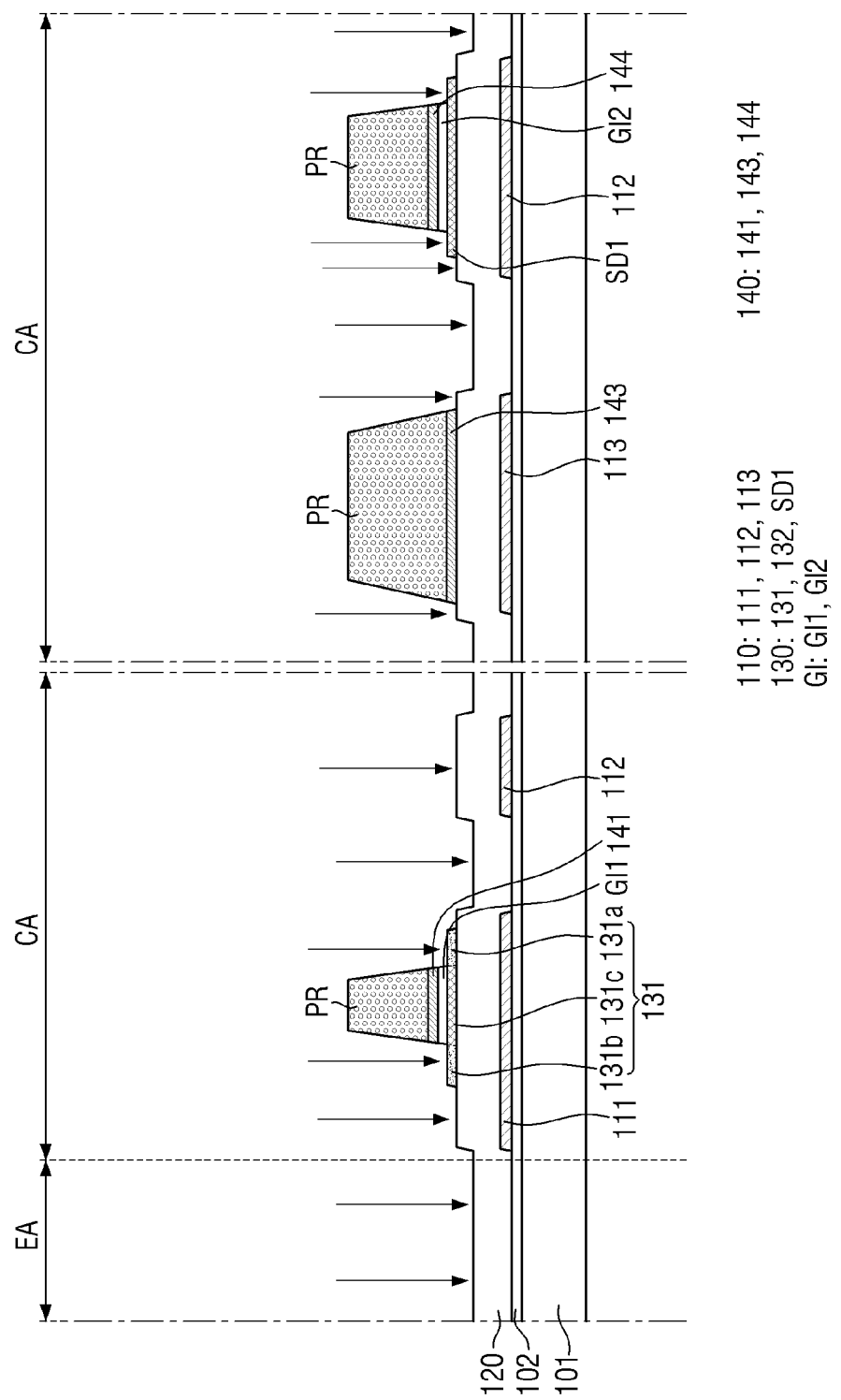
Figure 16:
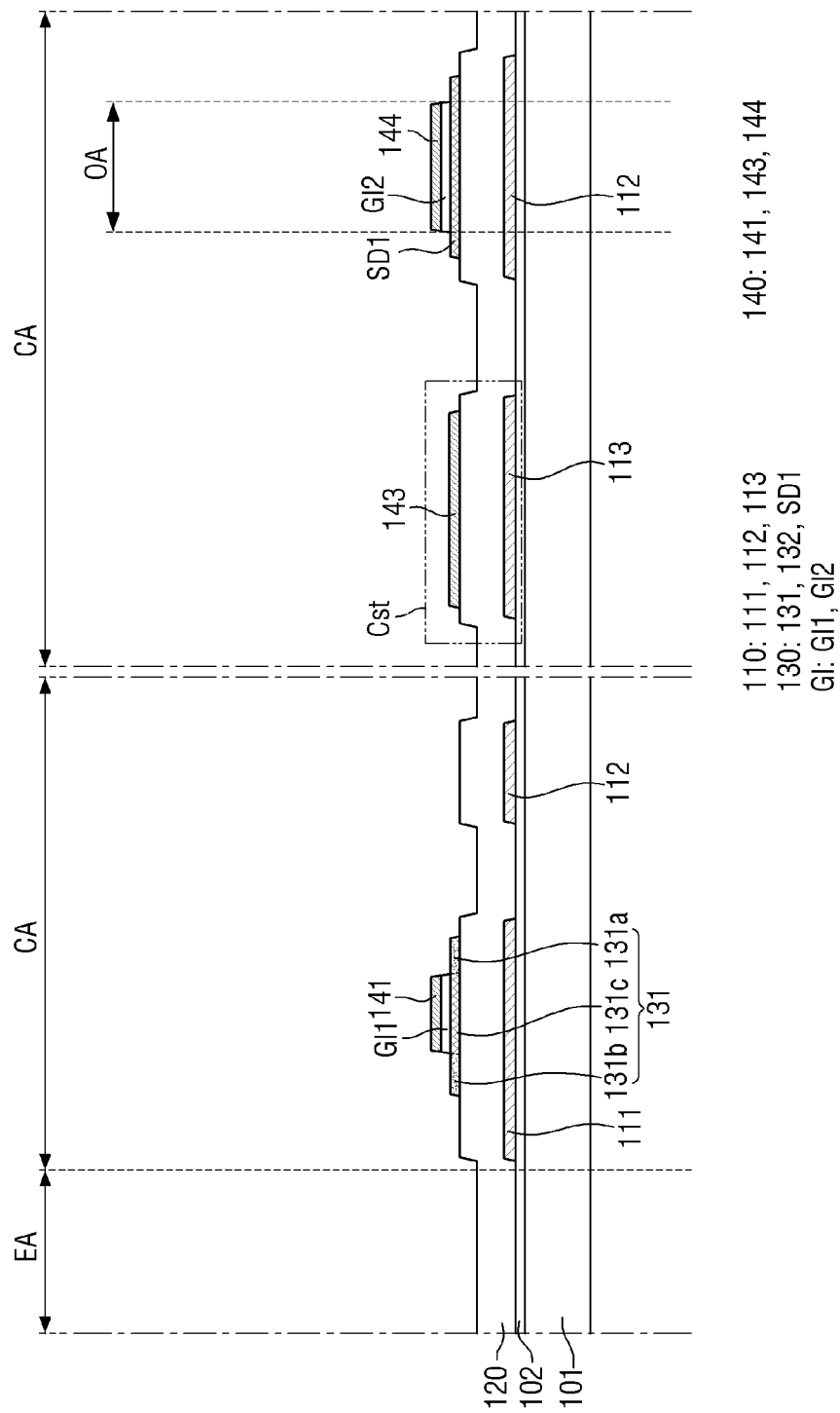

First, referring to FIGS. 7 and 8, the barrier layer 102 is formed on the entire surface of the base substrate 101, and the first conductive layer 110 is patterned on the barrier layer 102 (step S01).

Specifically, a first conductive layer material (not shown) may be applied onto the entire surface of the barrier layer 102 and patterned through a photolithography process to form the first conductive layer 110 as illustrated in FIG. 6. When the barrier layer 102 is omitted in another exemplary embodiment, the first conductive layer material (not shown) may be directly applied onto the base substrate 101.

Subsequently, referring to FIGS. 9 to 12, the buffer layer 120 is formed on the entire surface of the barrier layer 102 while covering the first conductive layer 110. The semiconductor layer 130 and the gate insulating layer GI are patterned on the buffer layer 120 (step S02).

Specifically, the patterned semiconductor layer 130 and gate insulating layer GI may be formed by one mask process. A semiconductor layer material 130a is subsequently deposited on the entire surface of the buffer layer 120, and a gate insulating layer material GIa is subsequently deposited on the entire surface of the semiconductor layer material 130a. Subsequently, after applying a photoresist layer PR on the gate insulating layer material GIa, a photoresist pattern is formed through exposure and development. Then, the semiconductor layer material 130a and the gate insulating layer material GIa are sequentially etched using the photoresist layer PR as an etching mask. Accordingly, the gate insulating layer GI including the first gate insulating layer pattern GI1 and the second gate insulating layer pattern GI2 is patterned. In addition, the semiconductor layer 130 including the semiconductor pattern 131 of the first transistor TR1, the semiconductor pattern 132 of the second transistor TR2, the first semiconductor dummy pattern SD1 and the second semiconductor dummy pattern SD2 is patterned. Thereafter, the photoresist layer PR is removed through a strip process or an ashing process.

The first semiconductor dummy pattern SD1 and the second semiconductor dummy pattern SD2 of the semiconductor layer 130 disposed in the overlap region ('OA' in FIGS. 5 and 6) may be formed together with the semiconductor pattern 131 of the first transistor TR1 and the semiconductor pattern 132 of the second transistor TR2 in the process of patterning the semiconductor layer 130. In addition, the second gate insulating layer pattern GI2 of the gate insulating layer GI disposed in the overlap region ('OA' in FIGS. 5 and 6) may be formed together with the first gate insulating layer pattern GI1 in a process of patterning the gate insulating layer GI. Accordingly, separate masks for forming the first semiconductor dummy pattern SD1, the second semiconductor dummy pattern SD2, and the second gate insulating layer pattern GI2 disposed in the overlap region ('ON in FIGS. 5 and 6) may not be added. That is, even if the first semiconductor dummy pattern SD1, the second semiconductor dummy pattern SD2, and the second gate insulating layer pattern GI2 are further formed, an additional process is unnecessary.

Next, referring to FIGS. 13 to 16, the second conductive layer 140 is formed on the gate insulating layer GI (step S03).

Specifically, the second conductive layer 140 may be formed by a mask process. A second conductive layer material 140a is deposited on the entire surface of the buffer layer 120 on which the semiconductor layer 130 and the gate insulating layer GI are formed. Subsequently, after applying a photoresist layer PR on the second conductive layer material 140a, a photoresist pattern is formed through exposure and development. Then, the second conductive layer material 140a and the gate insulating layer GI are sequentially etched using the photoresist layer PR as an etching mask. Although it is illustrated in the drawing that in the process of etching the second conductive layer material 140a, a portion of the gate insulating layer GI is etched such that a portion of the side surface of the second conductive layer 140 is aligned with a portion of the side surface of the gate insulating layer GI, the present disclosure according to the invention is not limited thereto.

Accordingly, the second conductive layer 140 including the gate electrode 141 of the first transistor TR1, the gate electrode (see '142' in FIG. 4) of the second transistor TR2, the second electrode 143 of the storage capacitor Cst, and the scan line 144 are patterned. Further, the gate insulating layer GI including the first gate insulating layer pattern GI1, and the second gate insulating layer pattern GI2 is patterned. The photoresist layer PR is then removed through a strip process or an ashing process.

Although not limited thereto, the first and second source/drain regions 131a and 131b and the channel region 131c of the first transistor TR1 may be formed through the above process. In addition, although not illustrated, first and second source/drain regions (not shown) and a channel region (not shown) of the second transistor TR2 may be formed through the above process.

In the above description, as an example, the photoresist layer PR is used as the etching mask until the gate insulating layer GI is patterned. However, the patterned upper layer may be used as a hard mask for etching the lower layer. In this case, the photoresist layer PR may be used as an etching mask together with the hard mask. As another example, after forming the hard mask, the photoresist layer PR may be removed, and the lower layer may be etched using the hard mask as an etching mask.

Figure 17:
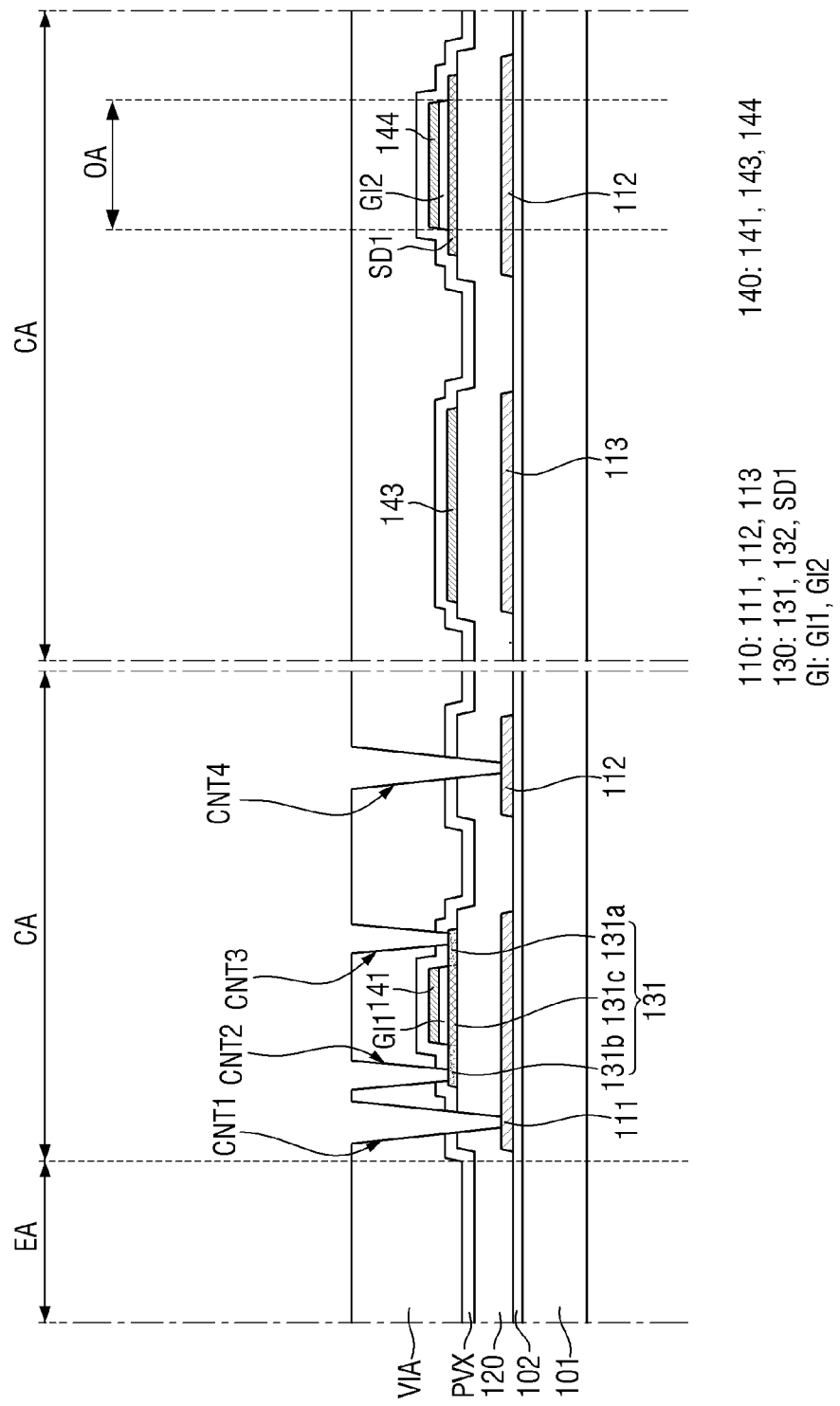

Then, referring to FIG. 17, the passivation layer PVX and the via layer VIA are formed on the second conductive layer 140, and contact holes (see 'CNT1 to CNT8' in FIG. 4) are formed (step S04). Although only the first to fourth contact holes CNT1 to CNT4 are illustrated in the drawing, fifth to eighth contact holes (see 'CNT5 to CNT8' in FIG. 4) may also be formed in step S04.

Specifically, the passivation layer PVX is deposited on the buffer layer 120 to cover the second conductive layer 140, the gate insulating layer GI, and the semiconductor layer 130. After depositing the passivation layer PVX, the via layer VIA is formed by applying a material layer for the via layer VIA on the passivation layer PVX. Thereafter, by etching the via layer VIA, the passivation layer PVX and/or the buffer layer 120, the first to eighth contact holes CNT1 to CNT8 exposing any one of the first conductive layer 110, the semiconductor layer 130 and the second conductive layer 140 may be formed to penetrate the via layer VIA, the passivation layer PVX and/or the buffer layer 120.

Figure 18:
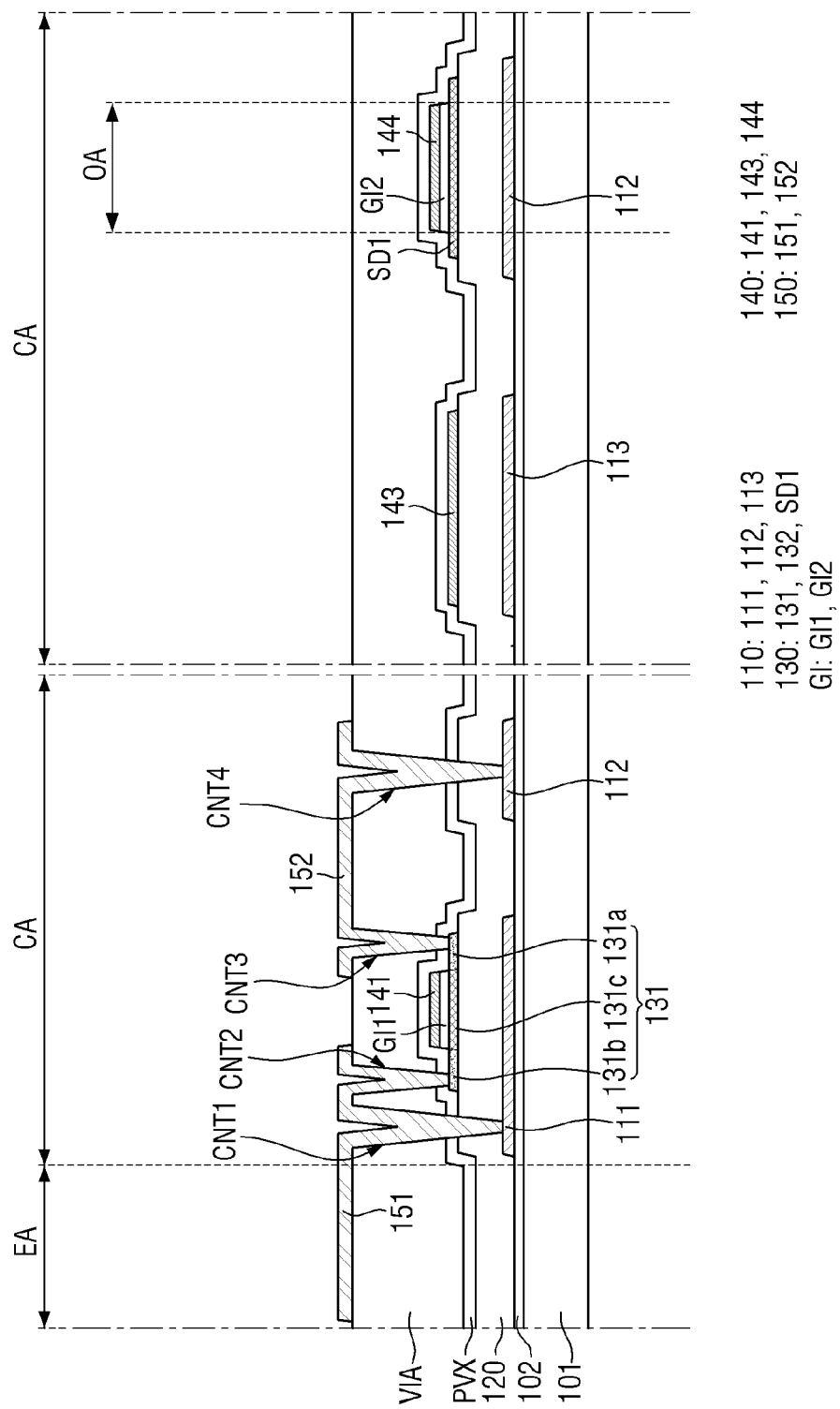

Then, referring to FIG. 18, the third conductive layer 150 is formed on the via layer VIA (step S05). Although only the first conductive pattern 151 and the second conductive pattern 152 are illustrated in the drawing, the third conductive pattern (see '153' in FIG. 4) and the fourth conductive pattern (see '154' in FIG. 4) may also be formed in step S05.

Specifically, the third conductive layer 150 may be formed by a mask process. A material layer (not shown) for the third conductive layer 150 is entirely deposited on the via layer VIA. In the deposition process, the material layer (not shown) for the third conductive layer 150 may be deposited to the inside of the contact holes CNT1 to CNT8. Accordingly, the third conductive layer 150 may be connected to at least one of the first conductive layer 110, the semiconductor layer 130, and the second conductive layer 140. Subsequently, a photoresist layer is coated on the material layer (not shown) for the third conductive layer, a photoresist pattern is formed through exposure and development, and then the material layer for the third conductive layer 150 is etched by using the photoresist layer as an etching mask. Thereafter, the photoresist layer is removed through a strip or ashing process to complete the patterned third conductive layer 150 as illustrated in FIGS. 4 and 18.

Figure 19:
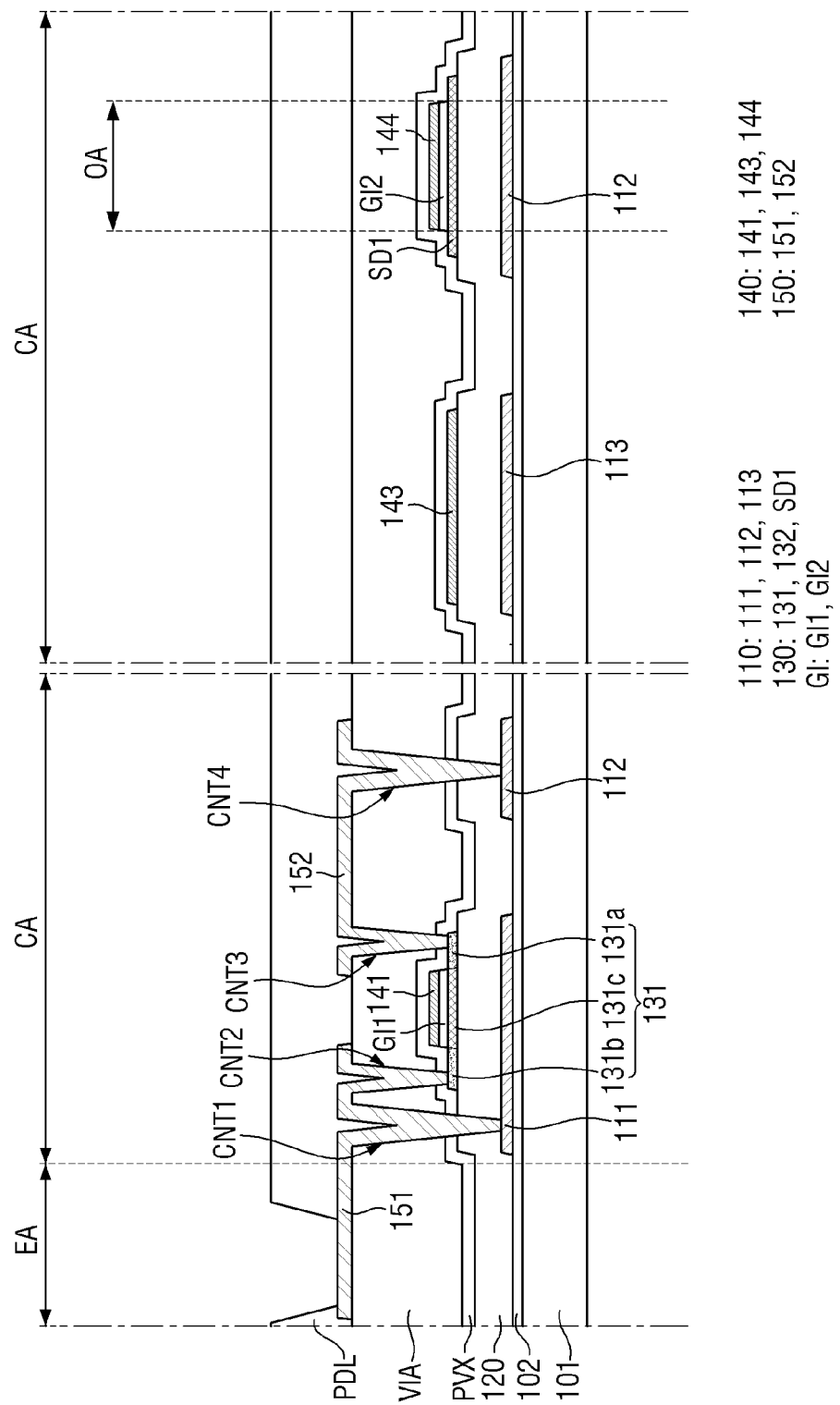

Then, referring to FIG. 19, a patterned pixel defining layer PDL is formed on the via layer VIA to cover the third conductive layer 150 (step S06).

Specifically, the pixel defining layer PDL may include, e.g., an organic material having a photosensitive material. In this case, the patterned pixel defining layer PDL may be formed by applying an organic material layer for the pixel defining layer, followed by exposure and development.

The pixel defining layer PDL may be formed along the boundaries of the pixels PX, and may partially overlap the third conductive layer 150. The pixel defining layer PDL may be formed to overlap the contact holes CNT1 to CNT8. When the third conductive layer 150 fails to completely fill an inner space of the contact holes CNT1 to CNT8 and only partially fills it, the pixel defining layer PDL may completely fill the inner space of the contact holes CNT1 to CNT8.

The light emitting layer EL, the cathode electrode CAT, and the thin film encapsulation layer 160 may be further disposed on the pixel defining layer PDL, but a method of fabricating the same is a well-known technique, and thus a detailed description thereof is omitted.

Hereinafter, other embodiments will be described. In the following embodiments, a description of the same components as those of the above-described embodiment will be omitted or simplified to avoid redundancy, and differences will be mainly described.

Figure 21:
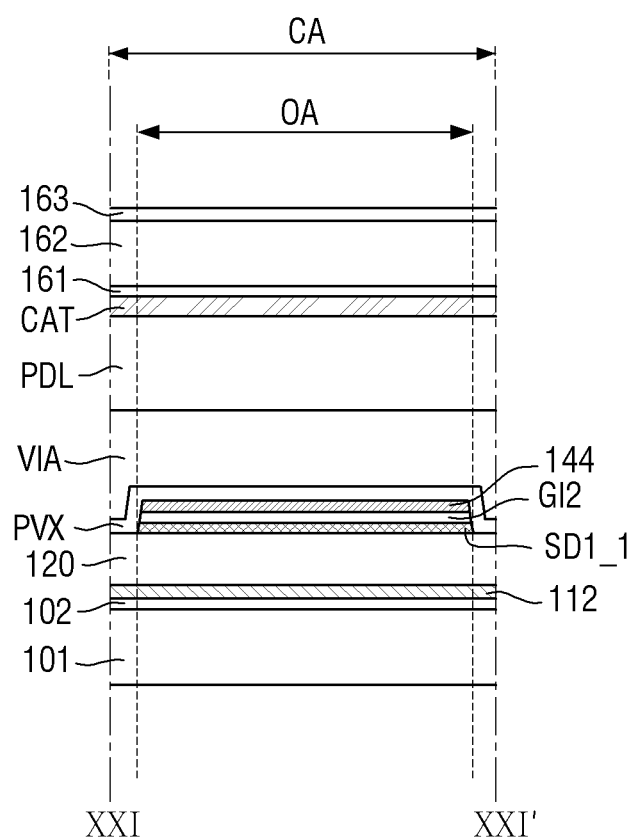
FIG. 21 is a cross-sectional view taken along line XXI-XXI' of FIG. 20.

FIG. 20 is an enlarged view of a peripheral region of a first semiconductor dummy pattern according to another embodiment. FIG. 21 is a cross-sectional view taken along line XXI-XXI' of FIG. 20.

Referring to FIGS. 20 and 21, the present embodiment is different from the embodiment of FIG. 5 in that a first semiconductor dummy pattern SD1_1 is disposed in the overlap region OA.

Specifically, the entire region of the first semiconductor dummy pattern SD1_1 according to the present embodiment may be disposed in the overlap region OA to cover the entire region of the overlap region OA. The first semiconductor dummy pattern SD1_1 may completely overlap the overlap region OA. In other words, the entire region of the first semiconductor dummy pattern SD1_1 may overlap the overlap region OA in the thickness direction (third direction DR3), and the entire region of the overlap region OA may overlap the first semiconductor dummy pattern SD1_1 in the thickness direction (third direction DR3). The length of the first semiconductor dummy pattern SD1_1 in the first direction DR1 may be the same as the width of the first power line 112 in the first direction DR1, and the length of the first semiconductor dummy pattern SD1_1 in the second direction DR2 may be the same as the width of the scan line 144 in the second direction DR2. Accordingly, a portion of the side surfaces of the first semiconductor dummy pattern SD1_1 may be aligned with a portion of the side surfaces of the first power line 112, and another portion of the side surfaces of the first semiconductor dummy pattern SD1_1 may be aligned with a portion of the side surfaces of the scan line 144.

Also in this case, as the first semiconductor dummy pattern SD1_1 is disposed in the overlap region OA, the distance in the thickness direction (third direction DR3) between the first power line 112 and the scan line 144 can be increased, and the capacitance of the parasitic capacitor that may occur in the above-mentioned region can be reduced.

Figure 22:
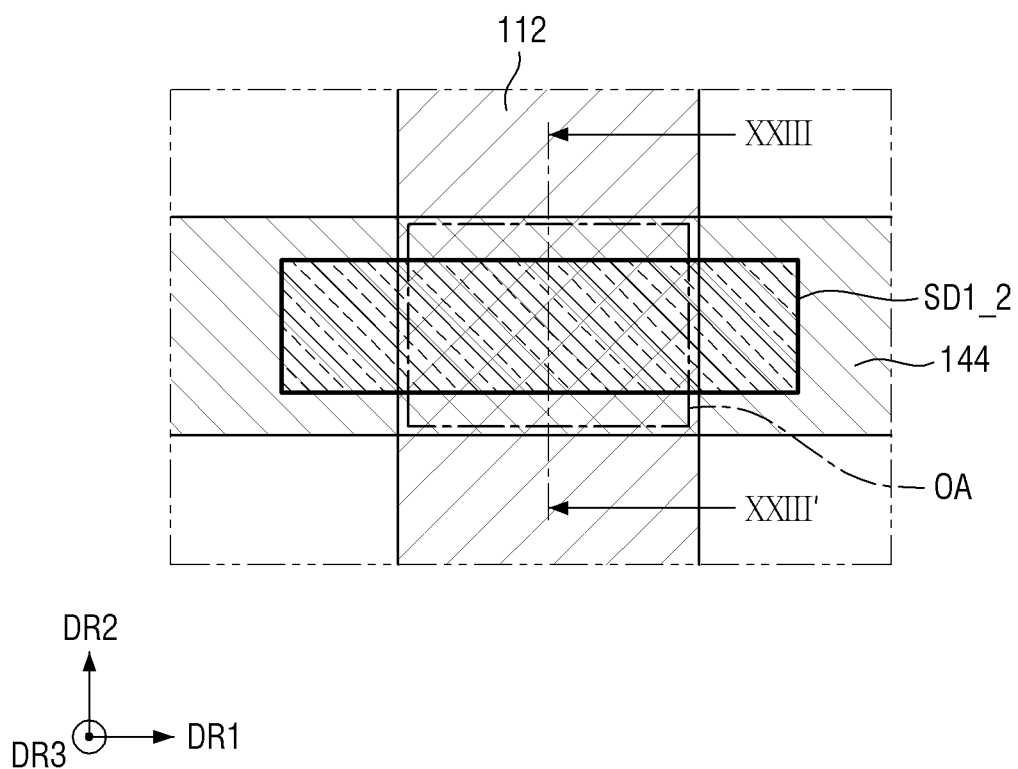
FIG. 22 is an enlarged view of a peripheral region of a first semiconductor dummy pattern according to still another embodiment.
Figure 23:
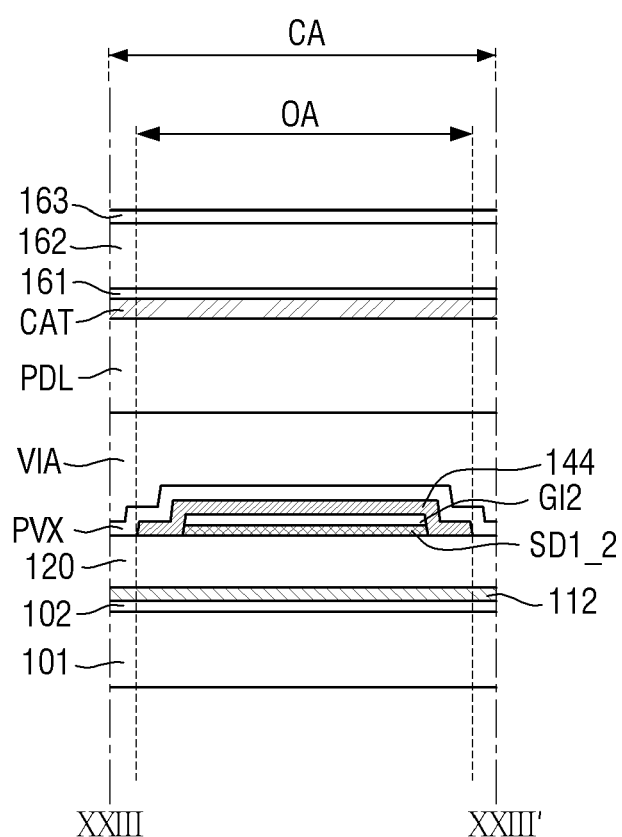
FIG. 23 is a cross-sectional view taken along line XXIII-XXIII' of FIG. 22.

FIG. 22 is an enlarged view of a peripheral region of a first semiconductor dummy pattern according to still another embodiment. FIG. 23 is a cross-sectional view taken along line XXIII-XXIII' of FIG. 22.

Referring to FIGS. 22 and 23, the present embodiment is different from the embodiment of FIG. 5 in that a first semiconductor dummy pattern SD1_2 covers a portion of the overlap region OA.

Specifically, the first semiconductor dummy pattern SD1_2 according to the present embodiment may be disposed in the overlap region OA to cover only a partial region of the overlap region OA. The first semiconductor dummy pattern SD1_2 may overlap a partial region of the overlap region OA in the thickness direction (third direction DR3) rather than the entire region thereof. Although the drawing illustrates that the length of the first semiconductor dummy pattern SD1_2 in the second direction DR2 is smaller than the width of the scan line 144 in the second direction DR2, the present disclosure according to the invention is not limited thereto, and the length of the first semiconductor dummy pattern SD1_2 in the first direction DR1 may be smaller than the width of the first power line 112 in the first direction DR1 in another exemplary embodiment.

Accordingly, the scan line 144 may be disposed on the side surface of the first semiconductor dummy pattern SD1_2 and/or the second gate insulating layer pattern GI2 while being in direct contact with the side surface of the first semiconductor dummy pattern SD1_2 and/or the side surface of the second gate insulating layer pattern GI2.

In this case, as the first semiconductor dummy pattern SD1_2 is disposed in the overlap region OA, in a region where the first semiconductor dummy pattern SD1_2 is disposed, the distance in the thickness direction (third direction DR3) between the first power line 112 and the scan line 144 can be increased, and the capacitance of the parasitic capacitor that may occur in the overlap region OA can be reduced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A display device comprising:
a substrate;
a first conductive layer disposed on the substrate and including a lower light blocking pattern and a first signal line;
a buffer layer disposed on the first conductive layer;
a semiconductor layer disposed on the buffer layer and including a first semiconductor pattern including a channel region of a transistor and a second semiconductor pattern separated from the first semiconductor pattern;
an insulating layer disposed on the semiconductor layer and including an insulating layer pattern;
a second conductive layer disposed on the insulating layer and including a second signal line;
a planarization layer disposed on the second conductive layer; and
a third conductive layer disposed on the planarization layer and including an anode electrode,
wherein the first semiconductor pattern is electrically connected to the lower light blocking pattern by the anode electrode, and
wherein at least a portion of the second semiconductor pattern is isolated from each of the first signal line and the second signal line, and
wherein the second semiconductor pattern overlaps each of the first signal line and the second signal line in a thickness direction.

2. The display device of claim 1, further comprising:
a storage capacitor including a first electrode and a second electrode,
wherein the first conductive layer includes the first electrode of the storage capacitor,
wherein the second conductive layer includes the second electrode of the storage capacitor, and
wherein a distance in the thickness direction between the first signal line and the second signal line is greater than a distance in the thickness direction between the first electrode and the second electrode of the storage capacitor.

3. The display device of claim 1, wherein the anode electrode is connected to the lower light blocking pattern through a first contact hole passing through the planarization layer and the buffer layer, and is connected to the first semiconductor pattern of the transistor through a second contact hole passing through the planarization layer.

4. The display device of claim 1, wherein the third conductive layer further includes a sub conductive pattern separated from the anode electrode, and the sub conductive pattern electrically connects the first signal line to the first semiconductor pattern of the transistor.

5. The display device of claim 4, wherein the sub conductive pattern contacts the first signal line through a third contact hole passing through the planarization layer and the buffer layer, and contacts the first semiconductor pattern of the transistor through a fourth contact hole passing through the planarization layer.

6. The display device of claim 1, wherein the first signal line is one of a first power line and a data line, and the second signal line is a scan line.

7. The display device of claim 6, wherein the second signal line extends in a first direction, the first signal line extends in a second direction intersecting the first direction, and the first signal line and the second signal line intersect each other in an overlap region.

8. The display device of claim 7, wherein a length of the second semiconductor pattern in the first direction is equal to or greater than a width of the first signal line in the first direction, and
wherein a length of the second semiconductor pattern in the second direction is equal to or greater than a width of the second signal line in the second direction.

9. The display device of claim 1, wherein an overlap region where the first signal line and the second signal line overlap each other completely overlaps the second semiconductor pattern in the thickness direction.

10. The display device of claim 9, wherein at least a portion of the insulating layer pattern is disposed in the overlap region and overlaps the second semiconductor pattern in the thickness direction.

* * * * *